(12) United States Patent
Yoneda et al.

(10) Patent No.: US 10,043,833 B2
(45) Date of Patent: Aug. 7, 2018

(54) SEMICONDUCTOR DEVICE

(71) Applicant: Semiconductor Energy Laboratory Co., Ltd., Atsugi-shi, Kanagawa-ken (JP)

(72) Inventors: Seiichi Yoneda, Atsugi (JP); Takuro Ohmaru, Zama (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/293,488

(22) Filed: Oct. 14, 2016

(65) Prior Publication Data

US 2017/0033130 A1 Feb. 2, 2017

Related U.S. Application Data

(63) Continuation of application No. 14/636,611, filed on Mar. 3, 2015, now Pat. No. 9,472,680, which is a (Continued)

(30) Foreign Application Priority Data

Dec. 1, 2011 (JP) ................................ 2011-263867

(51) Int. Cl.
*H01L 27/08* (2006.01)
*H01L 27/12* (2006.01)
(Continued)

(52) U.S. Cl.
CPC ...... *H01L 27/1251* (2013.01); *H01L 27/0688* (2013.01); *H01L 27/124* (2013.01);
(Continued)

(58) Field of Classification Search
CPC ........................ H01L 27/1251; H01L 29/7869
See application file for complete search history.

(56) References Cited

U.S. PATENT DOCUMENTS 4,555,721 A 11/1985 Bansal et al.
5,095,347 A 3/1992 Kirsch
(Continued)

FOREIGN PATENT DOCUMENTS

EP 1737044 A 12/2006
EP 2172972 A 4/2010
(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

(Continued)

*Primary Examiner* — Tran Tran
(74) *Attorney, Agent, or Firm* — Robinson Intellectual Property Law Office; Eric J. Robinson

(57) ABSTRACT

A semiconductor device includes a first transistor which includes a first gate electrode below its oxide semiconductor layer and a second gate electrode above its oxide semiconductor layer, and a second transistor which includes a first gate electrode above its oxide semiconductor layer and a second gate electrode below its oxide semiconductor layer and is provided so as to at least partly overlap with the first transistor. In the semiconductor device, a conductive film serving as the second gate electrode of the first transistor and the second gate electrode of the second transistor is shared between the first transistor and the second transistor. Note that the second gate electrode not only controls the threshold voltages (Vth) of the first transistor and the second transistor but also has an effect of reducing interference of an electric field applied from respective first gate electrodes of the first transistor and the second transistor.

24 Claims, 19 Drawing Sheets

Related U.S. Application Data continuation of application No. 13/683,029, filed on Nov. 21, 2012, now Pat. No. 8,981,367.

(51) Int. Cl.
*H01L 29/78* (2006.01)
*H01L 27/06* (2006.01)
*H01L 29/786* (2006.01)
*H01L 29/04* (2006.01)
H01L 27/088 (2006.01)

(52) U.S. Cl.
CPC ........ *H01L 27/1225* (2013.01); *H01L 29/045* (2013.01); *H01L 29/78* (2013.01); *H01L 29/7869* (2013.01); *H01L 29/78603* (2013.01); *H01L 29/78606* (2013.01); *H01L 29/78648* (2013.01); H01L 27/088 (2013.01)

(56) References Cited

U.S. PATENT DOCUMENTS

| | | | |
|---|---|---|---|
| 5,100,817 A | 3/1992 | Cederbaum et al. |
| 5,341,327 A | 8/1994 | Kuriyama |
| 5,470,776 A | 11/1995 | Ryou |
| 5,567,959 A | 10/1996 | Mineji |
| 5,731,856 A | 3/1998 | Kim et al. |
| 5,744,864 A | 4/1998 | Cillessen et al. |
| 5,770,483 A | 6/1998 | Kadosh et al. |
| 5,812,231 A | 9/1998 | Kochi et al. |
| 5,949,092 A | 9/1999 | Kadosh et al. |
| 5,977,580 A | 11/1999 | Yoon |
| 6,127,702 A | 10/2000 | Yamazaki et al. |
| 6,191,442 B1 | 2/2001 | Matsufusa |
| 6,294,274 B1 | 9/2001 | Kawazoe et al. |
| 6,429,484 B1 | 8/2002 | Yu |
| 6,515,511 B2 | 2/2003 | Sugibayashi et al. |
| 6,563,174 B2 | 5/2003 | Kawasaki et al. |
| 6,649,980 B2 | 11/2003 | Noguchi |
| 6,717,180 B2 | 4/2004 | Yamazaki et al. |
| 6,727,522 B1 | 4/2004 | Kawasaki et al. |
| 6,808,971 B2 | 10/2004 | Bhattacharyya |
| 6,846,703 B2 | 1/2005 | Shimoda et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,687,331 B2 | 3/2010 | Kim et al. |
| 7,696,063 B2 | 4/2010 | Tsuchiya |
| 7,732,819 B2 | 6/2010 | Akimoto et al. |
| 7,741,644 B2 | 6/2010 | Lyu et al. |
| 7,791,072 B2 | 9/2010 | Kumomi et al. |
| 7,940,085 B2 | 5/2011 | Kim et al. |
| 7,982,250 B2 | 7/2011 | Yamazaki et al. |
| 8,008,137 B2 | 8/2011 | Wu et al. |
| 8,049,253 B2 | 11/2011 | Isobe |
| 8,183,630 B2 | 5/2012 | Batude et al. |
| 8,217,680 B2 | 7/2012 | Kim et al. |
| 8,237,166 B2 | 8/2012 | Kumomi et al. |
| 8,278,162 B2 | 10/2012 | Akimoto et al. |
| 8,289,753 B2 | 10/2012 | Yamazaki et al. |
| 8,314,032 B2 | 11/2012 | Kawamura et al. |
| 8,339,828 B2 | 12/2012 | Yamazaki et al. |
| 8,378,341 B2 | 2/2013 | Hayashi et al. |
| 8,378,403 B2 | 2/2013 | Kato |
| 8,389,417 B2 | 3/2013 | Yamazaki et al. |
| 8,400,817 B2 | 3/2013 | Yamazaki et al. |
| 8,410,838 B2 | 4/2013 | Kato et al. |
| 8,450,783 B2 | 5/2013 | Yamazaki et al. |
| 8,559,220 B2 | 10/2013 | Yamazaki et al. |
| 8,610,187 B2 | 12/2013 | Yamazaki et al. |
| 8,659,934 B2 | 2/2014 | Yamazaki et al. |
| 8,704,221 B2 | 4/2014 | Yoneda et al. |
| 8,803,142 B2 | 8/2014 | Yamazaki et al. |
| 8,811,067 B2 | 8/2014 | Yamazaki et al. |
| 8,860,485 B2 | 10/2014 | Kato et al. |
| 9,236,385 B2 | 1/2016 | Yamazaki et al. |
| 9,350,334 B2 | 5/2016 | Kato et al. |
| 9,478,564 B2 | 10/2016 | Yamazaki et al. |
| 9,735,285 B2 | 8/2017 | Yamazaki et al. |
| 2001/0015450 A1 | 8/2001 | Sugibayashi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0127680 A1 | 7/2003 | Nomoto et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0181953 A1 | 8/2007 | Lyu et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0215906 A1 | 9/2007 | Wu et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |

(56) References Cited

U.S. PATENT DOCUMENTS

| | | |
|---|---|---|
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0014799 A1 | 1/2009 | Isobe |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0283763 A1 | 11/2009 | Park et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0140608 A1 | 6/2010 | Park et al. |
| 2010/0148171 A1 | 6/2010 | Hayashi et al. |
| 2011/0089417 A1 | 4/2011 | Yamazaki et al. |
| 2011/0101332 A1 | 5/2011 | Yamazaki et al. |
| 2011/0156027 A1 | 6/2011 | Yamazaki et al. |
| 2012/0001243 A1* | 1/2012 | Kato ............... H01L 27/0688 257/296 |
| 2012/0007085 A1 | 1/2012 | Suzuki et al. |
| 2012/0018808 A1 | 1/2012 | Isobe |
| 2012/0052625 A1 | 3/2012 | Yamazaki |
| 2012/0063208 A1 | 3/2012 | Koyama et al. |
| 2012/0273774 A1 | 11/2012 | Noda |
| 2013/0134418 A1 | 5/2013 | Hayashi et al. |
| 2013/0140569 A1 | 6/2013 | Yoneda et al. |
| 2013/0153890 A1 | 6/2013 | Yoneda |
| 2013/0161607 A1 | 6/2013 | Yoneda et al. |
| 2013/0161713 A1 | 6/2013 | Yamazaki et al. |
| 2013/0214279 A1 | 8/2013 | Nishimura et al. |
| 2016/0226471 A1 | 8/2016 | Kato et al. |
| 2017/0358683 A1 | 12/2017 | Yamazaki et al. |

FOREIGN PATENT DOCUMENTS

| | | | |
|---|---|---|---|
| EP | 2226847 A | | 9/2010 |
| EP | 2887395 A | | 6/2015 |
| JP | 60-198861 A | | 10/1985 |
| JP | 63-102264 A | | 5/1988 |
| JP | 63-210022 A | | 8/1988 |
| JP | 63-210023 A | | 8/1988 |
| JP | 63-210024 A | | 8/1988 |
| JP | 63-215519 A | | 9/1988 |
| JP | 63-239117 A | | 10/1988 |
| JP | 63-265818 A | | 11/1988 |
| JP | 01-246863 A | | 10/1989 |
| JP | 05-251705 A | | 9/1993 |
| JP | 06-013606 A | | 1/1994 |
| JP | 06-291269 A | | 10/1994 |
| JP | 07-094743 A | | 4/1995 |
| JP | 07-193251 A | | 7/1995 |
| JP | 08-148693 A | | 6/1996 |
| JP | 08-264794 A | | 10/1996 |
| JP | 09-191091 A | | 7/1997 |
| JP | 11-145431 A | | 5/1999 |
| JP | 11-505377 | | 5/1999 |
| JP | 2000-044236 A | | 2/2000 |
| JP | 2000-124418 A | | 4/2000 |
| JP | 2000-150900 A | | 5/2000 |
| JP | 2002-050704 A | | 2/2002 |
| JP | 2002-076356 A | | 3/2002 |
| JP | 2002-184993 A | | 6/2002 |
| JP | 2002-280558 A | | 9/2002 |
| JP | 2002-289859 A | | 10/2002 |
| JP | 2003-086000 A | | 3/2003 |
| JP | 2003-086808 A | | 3/2003 |
| JP | 2004-103957 A | | 4/2004 |
| JP | 2004-273614 A | | 9/2004 |
| JP | 2004-273732 A | | 9/2004 |
| JP | 2006-165528 A | | 6/2006 |
| JP | 2009-135350 A | | 6/2009 |
| JP | 2009-158939 A | | 7/2009 |
| JP | 2009-302530 A | | 12/2009 |
| JP | 2010-003910 A | | 1/2010 |
| JP | 2010-087518 A | | 4/2010 |
| JP | 2010-283338 A | | 12/2010 |
| JP | 2011-109084 A | | 6/2011 |
| JP | 2011-119713 A | | 6/2011 |
| JP | 2011-129896 A | | 6/2011 |
| JP | 2011-151383 A | | 8/2011 |
| WO | WO-2004/114391 | | 12/2004 |
| WO | WO-2008/023776 | | 2/2008 |
| WO | WO-2011/048968 | | 4/2011 |
| WO | WO-2011/055669 | | 5/2011 |
| WO | WO-2011/062075 | | 5/2011 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors By Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.

(56) References Cited

OTHER PUBLICATIONS

Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs". SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '03 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Leen.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3-A2O3-Bo Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

(56) References Cited

OTHER PUBLICATIONS

Park.J et al., "Electronic Transport Properties of Amorphous Indium-Gallium-Zinc Oxide Semiconductor Upon Exposure To Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

\* cited by examiner

SEMICONDUCTOR DEVICE

BACKGROUND OF THE INVENTION

1. Field of the Invention

The present invention relates to a semiconductor device and a method for manufacturing the semiconductor device.

Note that in this specification, a semiconductor device refers to any device that can function by utilizing semiconductor characteristics, and an electro-optical device, a semiconductor circuit, an electronic device, and the like are all semiconductor devices.

2. Description of the Related Art

A technique for forming a transistor by using a semiconductor film formed over a substrate having an insulating surface has attracted attention. The transistor is applied to a wide range of semiconductor devices such as an integrated circuit (IC) and an image display device (display device). A silicon-based semiconductor film is known as a semiconductor film applicable to the transistor. In recent years, an oxide semiconductor film has attracted attention.

For example, a transistor using an amorphous oxide semiconductor film which contains indium, gallium, and zinc and has an electron carrier concentration of lower than $10^{18}/cm^3$ is disclosed (see Patent Document 1).

Since the oxide semiconductor film has a high electron mobility, the operation speed of a transistor using the oxide semiconductor film is significantly higher than that of a transistor using an amorphous silicon film. Further, the transistor using the oxide semiconductor film has an advantage of suppression of equipment investment, because production equipment for the transistor using the amorphous silicon film can be applied thereto with partly improvement.

Further, a memory to which characteristics of a transistor using an oxide semiconductor film is applied has been proposed (see Patent Document 2). Note that an oxide semiconductor film can be formed by a technique for forming a thin film such as a sputtering method. Further, a transistor using an oxide semiconductor film can be manufactured through a process performed at a low temperature lower than or equal to about 350° C. Therefore, there are few limitations on manufacturing a transistor using an oxide semiconductor film so as to overlap with a transistor, which allows reduction in the cell area.

In a transistor using an oxide semiconductor film, carriers may be generated due to an impurity such as hydrogen and oxygen vacancy, and the threshold voltage (Vth) of the transistor may be shifted in a negative direction. Therefore, controlling the threshold voltage (Vth) of the transistor using an oxide semiconductor film by employing a structure of a transistor including gate electrodes above and below its oxide semiconductor film, in which a back gate electrode which forms a pair with a front gate electrode is provided, has been considered (see Patent Document 3).

REFERENCE

Patent Document

[Patent Document 1] Japanese Published Patent Application No. 2006-165528
[Patent Document 2] Japanese Published Patent Application No. 2011-151383
[Patent Document 3] Japanese Published Patent Application No. 2010-283338

SUMMARY OF THE INVENTION

To manufacture a transistor including gate electrodes above and below its oxide semiconductor layer, a front gate electrode (also referred to as a first gate electrode) and a back gate electrode (also referred to as a second gate electrode) are formed, and accordingly the number of steps is increased.

Further, the area per one transistor can be reduced in a semiconductor device by stacking a plurality of transistors each using an oxide semiconductor film; however, in the case where a transistor including gate electrodes above and below its oxide semiconductor layer is provided so as to at least partly overlap with a transistor including gate electrodes above and below its oxide semiconductor layer, a second gate electrode is provided per transistor.

In view of the foregoing, an object of one embodiment of the present invention is to improve the yield of a semiconductor device in which a transistor including gate electrodes above and below its oxide semiconductor layer overlaps with a transistor including gate electrodes above and below its oxide semiconductor layer. Further, an object of one embodiment of the present invention is to suppress an increase in the number of manufacturing steps of the semiconductor device.

One embodiment of the present invention is a semiconductor device including a first transistor including gate electrodes above and below its oxide semiconductor layer and a second transistor which includes gate electrodes above and below its oxide semiconductor layer and is provided so as to at least partly overlap with the first transistor. A conductive film serving as a second gate electrode is shared between the first transistor and the second transistor.

Note that the second gate electrode not only controls the threshold voltages (Vth) of the first transistor and the second transistor but also has an effect of reducing interference of an electric field applied from respective first gate electrodes of the first transistor and the second transistor.

Another embodiment of the present invention is a semiconductor device which includes an insulating film having a planar upper surface provided over a second transistor; a third transistor which has the same structure as a first transistor and is provided over the insulating film; and a fourth transistor which has the same structure as the second transistor and is provided so as to at least partly overlap with the third transistor. A conductive film serving as a second gate electrode is shared between the third transistor and the fourth transistor.

As described above, the first transistor and the second transistor can be configured to be one structure, and the plurality of structures can be provided so as to be stacked. Specifically, the number of the structures which are stacked may be 2 or more and 10 or less, preferably 3 or more and 20 or less, more preferably 5 or more and 50 or less. Needless to say, the number of the structures which are stacked may be set beyond 50.

In the case where the plurality of structures each described above are stacked, the conductive film serving as the second gate electrode is provided per 2 transistors. Accordingly, the number of steps for forming second gate electrodes can be reduced. In other words, one conductive film serving as a second gate electrode can be omitted per structure. Thus, in the case where the plurality of structures are provided so as to be stacked, breaking caused by stress during manufacture of the semiconductor device can be suppressed, so that a semiconductor device including more transistors can be manufactured. In other words, the semiconductor device can be highly integrated and the yield can be improved. Further, even when the plurality of structures are stacked as described above, interference of an electric field can be reduced by the effect of the second gate electrode.

Note that the semiconductor device of one embodiment of the present invention is suitable for a memory. This is because the cell area can be reduced by overlapping a plurality of memory cells.

Another embodiment of the present invention is a semiconductor device including a first transistor provided over an insulating surface and a second transistor provided so as to at least partly overlap with the first transistor. The first transistor includes a first conductive film; a first insulating film provided over the first conductive film; a first oxide semiconductor film provided over the first insulating film; a second conductive film and a third conductive film which are provided so as to be at least partly in contact with the first oxide semiconductor film; a second insulating film provided over the second conductive film, the third conductive film, and the first oxide semiconductor film; and a fourth conductive film provided over the second insulating film. The second transistor includes the fourth conductive film; a third insulating film provided over the fourth conductive film; a second oxide semiconductor film provided over the third insulating film; a fifth conductive film and a sixth conductive film which are provided so as to be at least partly in contact with the second oxide semiconductor film; a fourth insulating film provided over the fifth conductive film, the sixth conductive film, and the second oxide semiconductor film; and a seventh conductive film provided over the fourth insulating film. The first oxide semiconductor film at least partly overlaps with the first conductive film and the fourth conductive film. The second oxide semiconductor film at least partly overlaps with the fourth conductive film and the seventh conductive film. Note that a fifth insulating film having a planar upper surface is preferably provided over the seventh conductive film and the fourth insulating film of the second transistor.

Further, an embodiment of the present invention is a semiconductor device which has a second structure similar to a first structure including the first transistor and the second transistor over the first structure.

In the embodiment, the first conductive film at least partly serves as the first gate electrode of the first transistor. The seventh conductive film at least partly serves as the first gate electrode of the second transistor. The fourth conductive film at least partly serves as the second gate electrode of the first transistor. The fourth conductive film at least partly serves as the second gate electrode of the second transistor.

Another embodiment of the present invention is a semiconductor device including a first conductive film provided over an insulating surface; a first insulating film provided over the first conductive film; a first oxide semiconductor film which is provided over the first insulating film and at least partly overlaps with the first conductive film; a second conductive film and a third conductive film which are provided over the first oxide semiconductor film; a second insulating film provided over the second conductive film, the third conductive film, and the first oxide semiconductor film; a fourth conductive film which is provided over the second insulating film and at least partly overlaps with the second conductive film; a fifth conductive film which is provided over the second insulating film and at least partly overlaps with the first oxide semiconductor film; a third insulating film provided over the second insulating film, the fourth conductive film, and the fifth conductive film; a second oxide semiconductor film which is provided over the third insulating film and at least partly overlaps with the fifth conductive film; a sixth conductive film and a seventh conductive film which are provided over the second oxide semiconductor film; a fourth insulating film provided over the sixth conductive film, the seventh conductive film, and the second oxide semiconductor film; an eighth conductive film which is provided over the fourth insulating film and at least partly overlaps with the sixth conductive film; a ninth conductive film which is provided over the fourth insulating film and at least partly overlaps with the second oxide semiconductor film; a fifth insulating film provided over the fourth insulating film, the eighth conductive film, and the ninth conductive film; and a tenth conductive film provided over the fifth insulating film. Note that an opening reaching the third conductive film is formed in the second insulating film, the third insulating film, the second oxide semiconductor film, the seventh conductive film, the fourth insulating film, and the fifth insulating film. The tenth conductive film is in contact with the third conductive film through the opening. Note that a sixth insulating film having a planar upper surface is preferably provided over the tenth conductive film.

Another embodiment of the present invention is a semiconductor device including a first conductive film provided over an insulating surface; a first insulating film provided over the first conductive film; a first oxide semiconductor film which is provided over the first insulating film and at least partly overlaps with the first conductive film; a second conductive film and a third conductive film which are provided over the first oxide semiconductor film; a second insulating film provided over the second conductive film, the third conductive film, and the first oxide semiconductor film; a fourth conductive film which is provided over the second insulating film and at least partly overlaps with the second conductive film; a fifth conductive film which is provided over the second insulating film and at least partly overlaps with the first oxide semiconductor film; a third insulating film provided over the second insulating film, the fourth conductive film, and the fifth conductive film; a sixth conductive film which is provided over the third insulating film and at least partly overlaps with the fourth conductive film; a seventh conductive film provided over the third insulating film; a second oxide semiconductor film which is provided over the third insulating film, the sixth conductive film, and the seventh conductive film and at least partly overlaps with the fifth conductive film; a fourth insulating film provided over the sixth conductive film, the seventh conductive film, and the second oxide semiconductor film; an eighth conductive film which is provided over the fourth insulating film and at least partly overlaps with the second oxide semiconductor film; a fifth insulating film provided over the eighth conductive film; and a ninth conductive film provided over the fifth insulating film. Note that an opening reaching the third conductive film is formed in the second insulating film, the third insulating film, the second oxide semiconductor film, the seventh conductive film, the fourth insulating film, and the fifth insulating film. The ninth conductive film is in contact with the third conductive film through the opening. Note that a sixth insulating film having a planar upper surface is preferably provided over the ninth conductive film.

A conductive film serving as a second gate electrode is shared between two transistors each including gate electrodes above and below its oxide semiconductor layer, whereby the semiconductor device can be highly integrated and the yield can be improved. Further, it is possible to suppress an increase in the number of manufacturing steps of the semiconductor device

DETAILED DESCRIPTION OF THE INVENTION

Figure 1A:
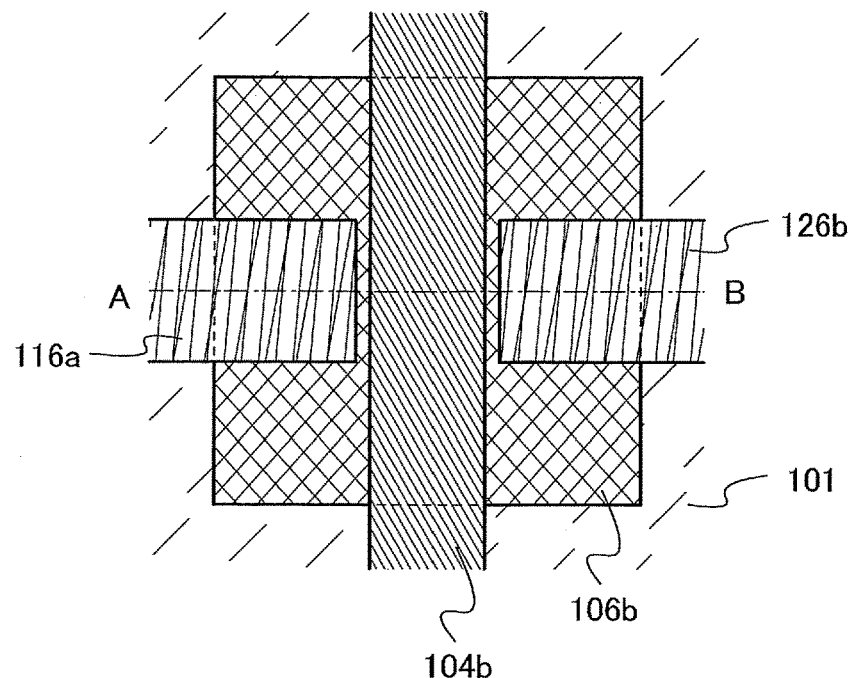
FIGS. 1A and 1B are a top view and a cross-sectional view, respectively, illustrating an example of a semiconductor device of one embodiment of the present invention.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments. In describing structures of the present invention with reference to the drawings, the same reference numerals are used in common for the same portions in different drawings. Note that the same hatch pattern is applied to similar parts, and the similar parts are not especially denoted by reference numerals in some cases.

In this specification, when one of a source and a drain of a transistor is called a drain, the other is called a source. That is, they are not distinguished depending on the potential level. Therefore, a portion called a source in this specification can be alternatively referred to as a drain.

Note that voltage refers to a potential difference between a predetermined potential and a reference potential (e.g., a ground potential or a source potential) in many cases. Accordingly, a voltage can also be called a potential. Even when a potential is represented as, for example, a potential VH, a potential VDD, or a potential GND, the potential is not exactly equal to the potential VH, the potential VDD, or the potential GND in some cases. Therefore, the potential VH, the potential VDD, and the potential GND can be referred to as a potential close to the potential VH, a potential close to the potential VDD, and a potential close to the potential GND, respectively. Note that "to be grounded" has the same meaning as "to be connected to GND".

Further, even when the expression "to be connected" is used in this specification, there is a case in which no physical connection is made in an actual circuit and a wiring is just extended.

Note that the ordinal numbers such as "first" and "second" in this specification are used for convenience and do not denote the order of steps or the stacking order of layers. In addition, the ordinal numbers in this specification do not denote particular names which specify the present invention.

Embodiment 1

In this embodiment, a semiconductor device of one embodiment of the present invention will be described with reference to FIGS. 1A and 1B, FIGS. 2A to 2D, FIGS. 3A to 3C, FIGS. 4A to 4C, FIGS. 5A and 5B, and FIGS. 6A and 6B.

Figure 1B:
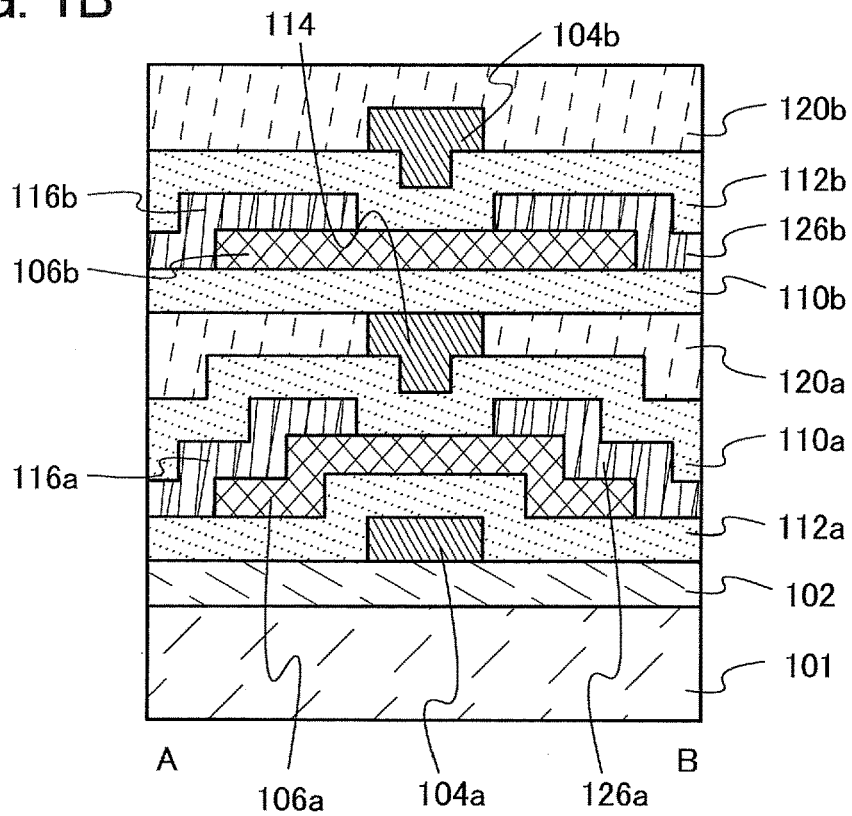

FIG. 1A is a top view illustrating a semiconductor device of one embodiment of the present invention. FIG. 1B is a cross-sectional view taken along dashed-dotted line A-B in FIG. 1A. In FIG. 1A, a film which is not seen due to overlap, an insulating film, and the like, are omitted for simplicity.

A semiconductor device illustrated in FIG. 1B includes a first conductive film 104a provided over a first insulating film 102 which is provided over a substrate 101; a second insulating film 112a provided over the first conductive film 104a and the first insulating film 102; a first oxide semiconductor film 106a which is provided over the second insulating film 112a and at least partly overlaps with the first conductive film 104a; a second conductive film 116a provided over the first oxide semiconductor film 106a; a third conductive film 126a provided over the first oxide semiconductor film 106a; a third insulating film 110a provided over the second conductive film 116a, the third conductive film 126a, and the first oxide semiconductor film 106a; a fourth conductive film 114 which is provided over the third insulating film 110a and at least partly overlaps with the first oxide semiconductor film 106a and the first conductive film 104a; a fourth insulating film 120a which is provided over the third insulating film 110a and whose upper surface is level with that of the fourth conductive film 114; a fifth insulating film 110b provided over the fourth conductive film 114 and the fourth insulating film 120a; a second oxide semiconductor film 106b which is provided over the fifth insulating film 110b and at least partly overlaps with the fourth conductive film 114; a fifth conductive film 116b which is provided over the second oxide semiconductor film 106b and which at least partly overlap with the second conductive film 116a; a sixth conductive film 126b which is provided over the second oxide semiconductor film 106b and which at least partly overlap with the third conductive film 126a; a sixth insulating film 112b provided over the fifth conductive film 116b, the sixth conductive film 126b, and the second oxide semiconductor film 106b; and a seventh conductive film 104b which is provided over the sixth insulating film 112b and at least partly overlaps with the second oxide semiconductor film 106b and the fourth conductive film 114. Note that a seventh insulating film 120b having a planar upper surface is preferably provided over the seventh conductive film 104b and the sixth insulating film 112b.

Note that in FIG. 1B, the first conductive film 104a, the fourth conductive film 114, and the seventh conductive film 104b do not overlap with any of the second conductive film 116a, the third conductive film 126a, the fifth conductive film 116b, and the sixth conductive film 126b; however, embodiments of the present invention are not limited thereto. For example, the first conductive film 104a, the fourth conductive film 114, and the seventh conductive film 104b may at least partly overlap with the second conductive film 116a, the third conductive film 126a, the fifth conductive film 116b, and the sixth conductive film 126b.

There is no particular limitation on the substrate 101 as long as it has heat resistance enough to withstand at least heat treatment performed later. For example, a glass substrate, a ceramic substrate, a quartz substrate, or a sapphire substrate may be used as the substrate 101. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used as the substrate 101. Still alternatively, any of these substrates further provided with a semiconductor element may be used as the substrate 101.

In the case of using a large glass substrate such as the fifth generation (1000 mm×1200 mm or 1300 mm×1500 mm); the sixth generation (1500 mm×1800 mm); the seventh generation (1870 mm×2200 mm); the eighth generation (2200 mm×2500 mm); the ninth generation (2400 mm×2800 mm); or the tenth generation (2880 mm×3130 mm) as the substrate 101, in some cases, microfabrication is difficult due to the shrinkage of the substrate 101, which is caused by heat treatment or the like in a manufacturing process of the semiconductor device. Accordingly, in the case of using a large glass substrate described above as the substrate 101, a substrate with small shrinkage is preferably used. For example, a large glass substrate whose shrinkage by heat treatment for one hour at 400° C., preferably 450° C., more preferably 500° C. is less than or equal to 10 ppm, preferably less than or equal to 5 ppm, more preferably less than or equal to 3 ppm, may be used as the substrate 101.

Further, a flexible substrate may be used as the substrate 101. Note that as a method for forming a transistor over a flexible substrate, there is also a method in which, after a transistor is formed over a non-flexible substrate, the transistor is separated and transferred to the substrate 101 which is a flexible substrate. In that case, a separation layer is preferably provided between the non-flexible substrate and the transistor.

The first insulating film 102 is provided in order that an impurity attributed to the substrate 101 does not adversely affect the first oxide semiconductor film 106a. In contrast, in the case where the substrate 101 does not contain an impurity, the first insulating film 102 is not necessarily provided.

The first insulating film 102 may be formed of a single layer or a stacked layer of an insulating film(s) containing any of aluminum oxide, aluminum nitride, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide.

In this specification, silicon oxynitride refers to a substance that contains more oxygen than nitrogen. For example, silicon oxynitride includes oxygen, nitrogen, silicon, and hydrogen at concentrations ranging from greater than or equal to 50 atomic % and less than or equal to 70 atomic %, greater than or equal to 0.5 atomic % and less than or equal to 15 atomic %, greater than or equal to 25 atomic % and less than or equal to 35 atomic %, and greater than or equal to 0 atomic % and less than or equal to 10 atomic %, respectively. In addition, silicon nitride oxide refers to a substance that contains a larger amount of nitrogen than that of oxygen. For example, silicon nitride oxide contains oxygen, nitrogen, silicon, and hydrogen at concentrations ranging from greater than or equal to 5 atomic % and less than or equal to 30 atomic %, greater than or equal to 20 atomic % and less than or equal to 55 atomic %, greater than or equal to 25 atomic % and less than or equal to 35 atomic %, and greater than or equal to 10 atomic % and less than or equal to 25 atomic %, respectively. Note that the above ranges are ranges for cases where measurement is performed using Rutherford backscattering spectrometry (RBS) and hydrogen forward scattering spectrometry (HFS). Moreover, the total of the percentages of the constituent elements does not exceed 100 atomic %.

The first conductive film 104a at least partly serves as a first gate electrode in a transistor using the first oxide semiconductor film 106a. For example, the first conductive film 104a may be formed of a single layer or a stacked layer of a simple substance selected from Al, Ti, Cr, Co, Ni, Cu, Y, Zr, Mo, Ag, Ta, and W; a nitride containing one or more kinds of the above substances; an oxide containing one or more kinds of the above substances; or an alloy containing one or more kinds of the above substances. Alternatively, an oxide or an oxynitride which contains at least In and Zn may be used. For example, an In—Ga—Zn—O—N compound may be used.

The second insulating film 112a at least partly serves as a gate insulating film. For example, the second insulating film 112a may be formed of a single layer or a stacked layer of an insulating film(s) containing any of aluminum oxide, magnesium oxide, silicon oxide, silicon oxynitride, germanium oxide, yttrium oxide, zirconium oxide, lanthanum oxide, neodymium oxide, hafnium oxide, and tantalum oxide.

The first oxide semiconductor film 106a includes a channel region in a region which overlaps with the first conductive film 104a. Note that the channel region is a region in which a channel is formed by the electric field of a gate electrode. When the channel is formed, current flows by application of voltage between a source and a drain.

The first oxide semiconductor film 106a may be formed using an In-M-Zn—O compound, for example. Here, a metal element M is an element whose bond energy with oxygen is higher than that of In and that of Zn. Alternatively, the metal element M is an element which has a function of suppressing desorption of oxygen from the In-M-Zn—O compound. Owing to the effect of the metal element M, generation of oxygen vacancies in the oxide semiconductor film is suppressed. Therefore, change in characteristics of the transistor, which is caused by oxygen vacancies, can be reduced; accordingly, a highly reliable transistor can be obtained.

The metal element M may be, specifically, Al, Sc, Ti, V, Cr, Mn, Fe, Co, Ni, Ga, Y, Zr, Nb, Mo, Sn, La, Ce, Pr, Nd, Sm, Eu, Gd, Tb, Dy, Ho, Er, Tm, Yb, Lu, Hf, Ta, or W, and is preferably Al, Ti, Ga, Y, Zr, Ce, or Hf. As the metal element M, one or two or more kinds of the above elements may be selected. Further, Si or Ge may be used instead of the metal element M.

The first oxide semiconductor film 106a is in a single crystal state, a polycrystalline (also referred to as polycrystal) state, an amorphous state, or the like.

The first oxide semiconductor film 106a is preferably a CAAC-OS (c-axis aligned crystalline oxide semiconductor) film.

The CAAC-OS film is not completely single crystal nor completely amorphous. The CAAC-OS film is an oxide semiconductor film having a crystal-amorphous mixed structure in which an amorphous phase includes a crystal portion and an amorphous portion. Note that in most cases, the crystal portion fits inside a cube whose one side is less than 100 nm. From an observation image obtained with a transmission electron microscope (TEM), a boundary between an amorphous portion and a crystal portion in the CAAC-OS film is not clear. Further, with the TEM, a grain boundary in the CAAC-OS film is not found. Thus, in the CAAC-OS film, a reduction in carrier mobility, due to the grain boundary, is suppressed.

In each of the crystal portions included in the CAAC-OS film, a c-axis is aligned in a direction perpendicular to a surface where the CAAC-OS film is formed or a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal portions, the directions of the a-axis and the b-axis of one crystal portion may be different from those of another crystal portion. In this specification, a simple term "perpendicular" includes a range from 85° to 95°.

In the CAAC-OS film, distribution of crystal portions is not necessarily uniform. For example, in the formation process of the CAAC-OS film, in the case where crystal growth starts from a surface side of the first oxide semiconductor film 106a, the proportion of crystal portions in the vicinity of the surface of the first oxide semiconductor film 106a is higher than that in the vicinity of the surface where the first oxide semiconductor film 106a is formed in some cases. Further, when an impurity is added to the CAAC-OS film, the crystal portion in a region to which the impurity is added becomes amorphous in some cases.

Since the c-axes of the crystal portions included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal portion is the direction parallel to a normal vector of the surface where the CAAC-OS film is formed or a normal vector of the surface of the CAAC-OS film. The crystal portion is formed by film formation or by performing treatment for crystallization such as heat treatment after film formation.

Further, change in characteristics of a transistor using the CAAC-OS film, due to irradiation with visible light or ultraviolet light is small. Thus, the transistor has high reliability.

Note that the oxide semiconductor film (here, each of the first oxide semiconductor film 106a and the second oxide semiconductor film 106b) is preferably an oxide semiconductor film which is highly purified and hardly contains impurities such as copper, aluminum, and chlorine. In a process of forming the transistor, a process in which there is not a possibility that the impurities are mixed into the oxide semiconductor film or attached to surfaces of the oxide semiconductor film is preferably selected as appropriate. In the case where the impurities are attached to the surfaces of the oxide semiconductor film, exposure to oxalic acid or dilute hydrofluoric acid, or plasma treatment ($N_2O$ plasma treatment or the like) is preferably performed to remove the impurities attached to the surfaces of the oxide semiconductor film. Specifically, the copper concentration in the oxide semiconductor film is $1\times10^{18}$ atoms/cm$^3$ or less, preferably $1\times10^{17}$ atoms/cm$^3$ or less. The aluminum concentration in the oxide semiconductor film is $1\times10^{18}$ atoms/cm$^3$ or less. The chlorine concentration in the oxide semiconductor film is $2\times10^{18}$ atoms/cm$^3$ or less.

In addition, it is preferable that the oxide semiconductor layer contain oxygen in a proportion higher than that in the stoichiometric composition to be supersaturated shortly after the oxide semiconductor layer is deposited. For example, in the case of depositing the oxide semiconductor film by a sputtering method, deposition is preferably performed under conditions where the proportion of oxygen contained in a deposition gas is high, in particular, in an oxygen atmosphere. When deposition is performed under conditions where the proportion of oxygen contained in a deposition gas is high, in particular, in an oxygen atmosphere, Zn is prevented from being released from the oxide semiconductor film even when the deposition temperature is higher than or equal to 300° C.

Here, the oxide semiconductor film is preferably highly purified by sufficient removal of impurities such as hydrogen therefrom. Further, the oxide semiconductor film is preferably supersaturated with oxygen by sufficient supply of oxygen. Specifically, the hydrogen concentration in the oxide semiconductor film is $5\times10^{20}$ atoms/cm$^3$ or less, preferably $5\times10^{19}$ atoms/cm$^3$ or less, more preferably $5\times10^{18}$ atoms/cm$^3$ or less, still more preferably $5\times10^{17}$ atoms/cm$^3$ or less. Note that the hydrogen concentration in the oxide semiconductor film is measured by secondary ion mass spectrometry (SIMS). Further, an insulating film (e.g. a SiOx film) containing excess oxygen is provided so as to be in contact with and thus cover the oxide semiconductor film so that the oxide semiconductor film can be supersaturated with oxygen by sufficient supply of oxygen.

Further, the hydrogen concentration in the insulating film containing excess oxygen is also an important factor because it affects the characteristics of the transistor.

An influence of the hydrogen concentration in the insulating film containing excess oxygen on the characteristics of the transistor will be described below.

First, hydrogen was intentionally added into the insulating film containing excess oxygen, and the hydrogen concentration was measured by SIMS.

A method for forming samples will be described below.

First, a glass substrate was prepared, and a silicon oxide film was formed over the glass substrate to a thickness of 300 nm by a sputtering method.

The silicon oxide film was formed under the following conditions: a quartz target was used; the pressure was 0.4 Pa; the power was 1.5 kW (13.56 MHz); and the substrate temperature in the film formation was 100° C.

Four kinds of samples were prepared. Note that respective conditions for forming the samples were similar to one another except for the flow rate ratio of the deposition gas for the silicon oxide film, oxygen gas ($O_2$), a deuterium gas ($D_2$), and an argon gas (Ar).

Table 1 shows names of the samples; the flow rate ratios of deposition gases used for deposition of silicon oxide films; the D (deuterium atom) concentrations at depths of 30 nm in the silicon oxide films; and the H (hydrogen atom) concentrations at depths of 30 nm in the silicon oxide films. Note that as for the proportions of $D_2$ ($D_2$ ($O_2$+Ar+$D_2$)) in the deposition gases for the samples, the proportion of $D_2$ in Sample 1 was 0 vol %, the proportion of $D_2$ in Sample 2 was 0.005 vol %, the proportion of $D_2$ in Sample 3 was 0.50 vol %, and the proportion of $D_2$ in Sample 4 was 2.50 vol %.

protective insulating film 2118 provided over the gate electrode 2104 and the gate insulating film 2112.

As the insulating film 2102, any of Samples 1 to 4 shown in Table 1 was used. The thickness of the insulating film 2102 was 300 nm.

As the substrate 2100, a glass substrate was used. As the oxide semiconductor film 2106, a 20 nm-thick IGZO film (formed using a target of In:Ga:Zn=1:1:1 [atomic ratio]) was used. As the pair of electrodes 2116, a 100 nm-thick tungsten film was used. As the gate insulating film 2112, a 30 nm-thick silicon oxynitride film was used. As the gate electrode 2104, a film of a 15 nm-thick tantalum nitride film and a 135 nm-thick tungsten film, which was stacked in this order from the gate insulating film 2112 side, was used. As the protective insulating film 2118, a 300 nm-thick silicon oxynitride film was used.

A BT stress test was performed on the transistors having the above-described structure. Note that for the measurement, the transistors each of which had a channel length (L) of 10 μm and a channel width (W) of 10 μm and in each of which the length (Lov) of a portion where the gate electrode 2104 overlaps with each of the pair of electrodes 2116 in the channel length direction was 1 μm (2 μm in total) were used. A method for the BT stress test will be described below.

First, the drain current (Id) was measured under conditions that the substrate temperature was 25° C., the drain voltage ($V_d$) of the transistor was 3 V, and the gate voltage ($V_g$) of the transistor was swept from −6 V to 6 V. The characteristics of the transistor measured in this manner are called "characteristics of the transistor before the BT stress test", which are represented by voltage relative to the source potential.

Next, $V_d$ was set to 0.1 V, $V_g$ was set to −6 V, and the substrate temperature was set to 150° C., under which the transistors were kept for one hour.

TABLE 1

| Name of Sample | $O_2$ [sccm] | Ar [sccm] | $D_2$ [sccm] | Proportion of $D_2$ | Concentration of D [atoms/cm$^3$] | Concentration of H [atoms/cm$^3$] |
|---|---|---|---|---|---|---|
| Sample 1 | 25 | 25 | 0 | 0% | 5.1E+15 | 6.4E+19 |
| Sample 2 | 25 | 24.9975 | 0.0025 | 0.005% | 1.6E+19 | 1.4E+20 |
| Sample 3 | 25 | 24.75 | 0.25 | 0.5% | 5.6E+20 | 7.2E+19 |
| Sample 4 | 25 | 23.75 | 1.25 | 2.5% | 7.2E+20 | 1.9E+19 |

Table 1 shows that the higher the proportion of $D_2$ in the deposition gases is, the higher the D concentration in the silicon oxide film is.

Next, transistors were formed using Samples 1 to 4 shown in Table 1.

Figure 19A:
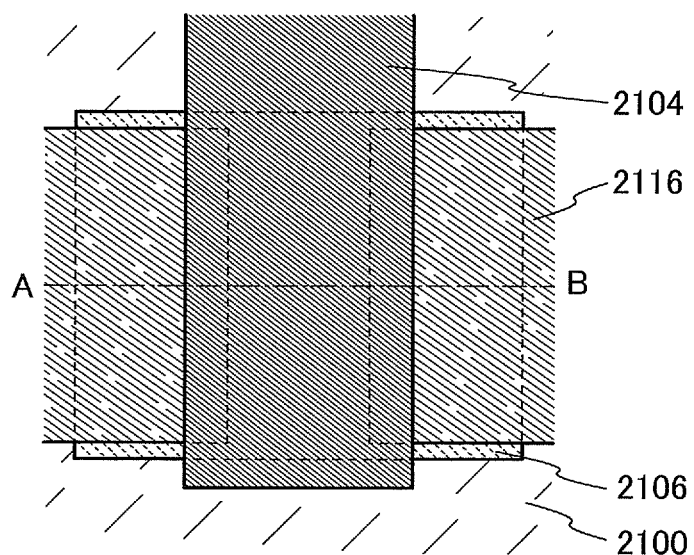
FIGS. 19A and 19B are a top view and a cross-sectional view, respectively, illustrating a structure of a transistor.
Figure 19B:
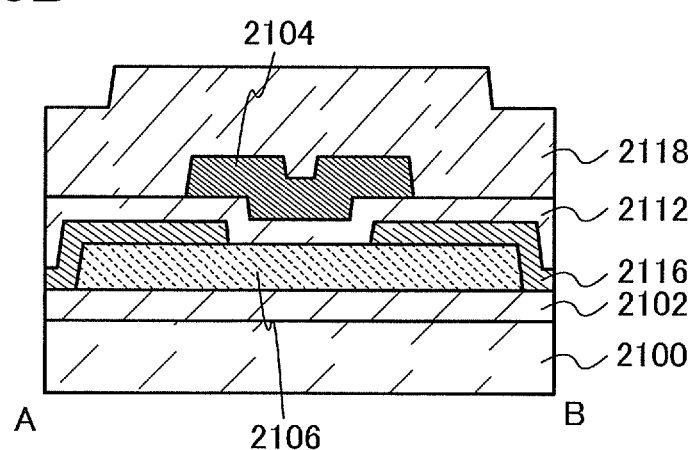

FIG. 19A is a top view illustrating each of transistors which were objects to be measured. FIG. 19B is a cross-sectional view taken along dashed-dotted line A-B in FIG. 19A. Note that for simplicity, a protective insulating film 2118, a gate insulating film 2112, an insulating film 2102, and the like are omitted in FIG. 19A.

The transistor illustrated in FIG. 19B includes a substrate 2100; the insulating film 2102 which contains excess oxygen and is provided over the substrate 2100; an oxide semiconductor film 2106 provided over the insulating film 2102; a pair of electrodes 2116 provided over the oxide semiconductor film 2106; the gate insulating film 2112 provided so as to cover the oxide semiconductor film 2106 and the pair of electrodes 2116; a gate electrode 2104 provided so as to overlap with the oxide semiconductor film 2106 with the gate insulating film 2112 interposed therebetween; and the Next, the drain current (Id) was measured under conditions that the substrate temperature was 25° C., the drain voltage ($V_d$) of the transistor was 3 V, and the gate voltage ($V_g$) of the transistor was swept from −6 V to 6 V. The characteristics of the transistor measured in this manner are called "characteristics of the transistor after the BT stress test".

Table 2 shows threshold voltage ($V_{th}$) and field effect mobility ($\mu_{FE}$) before and after the BT stress test. Note that names of Samples shown in Table 2 corresponds to the names of Samples shown in Table 1; Table 1 can be referred to for the conditions of the insulating film 2102.

TABLE 2

| | Before BT stress test | | After BT stress test | |
|---|---|---|---|---|
| Name of Samples | Vth [V] | $\mu_{FE}$ [cm$^2$/Vs] | Vth [V] | $\mu_{FE}$ [cm$^2$/Vs] |
| Sample 1 | 0.94 | 8.6 | 1.17 | 7.8 |
| Sample 2 | 0.82 | 8.6 | 1.03 | 8.2 |

TABLE 2-continued

| Name of Samples | Before BT stress test | | After BT stress test | |
|---|---|---|---|---|
| | Vth [V] | $\mu_{FE}$ [cm²/Vs] | Vth [V] | $\mu_{FE}$ [cm²/Vs] |
| Sample 3 | 0.89 | 8.8 | 1.05 | 7.8 |
| Sample 4 | 0.71 | 8.7 | 0.43 | 2.5 |

According to Table 2, it was found that in Sample 4, the field effect mobility ($\mu_{FE}$) was drastically decreased as a result of the BT stress test.

Further, characteristics of respective transistors having smaller L were measured. As a result, variation in threshold voltage (Vth) in a negative direction was larger in Sample 4 than in the other Samples.

As described above, it was found that abnormality of characteristics of the transistor is caused in the case where the D concentration in the silicon oxide film was $7.2\times10^{20}$ atoms/cm³ in the transistor having a structure in which the silicon oxide film was in contact with the oxide semiconductor film.

As described above, in the case where the hydrogen concentration in the insulating film containing excess oxygen is greater than or equal to $7.4\times10^{20}$ atoms/cm³ (greater than or equal to the total concentration of the D concentration of $7.2\times10^{20}$ atoms/cm³+the H concentration of $1.9\times10^{19}$ atoms/cm³), it is found that variation in characteristics of the transistor is increased and a channel length dependence of the transistor is increased. Further, the characteristics of the transistor are significantly deteriorated by the BT stress test. Therefore, the hydrogen concentration in the insulating film containing excess oxygen is preferably less than $7.4\times10^{20}$ atoms/cm³. Specifically, the hydrogen concentration in the oxide semiconductor film is preferably less than or equal to $5\times10^{19}$ atoms/cm³, and the hydrogen concentration in the insulating film containing excess oxygen is preferably less than $7.4\times10^{20}$ atoms/cm³.

Further, a blocking layer (e.g. an AlOx film) which suppress release of oxygen from the oxide semiconductor film is preferably provided outside the insulating film containing excess oxygen so as to cover the oxide semiconductor film.

The insulating layer containing excessive oxygen or the blocking layer is provided to cover the oxide semiconductor layer, whereby the oxide semiconductor layer can contain oxygen in a proportion which is substantially the same as that in the stoichiometric composition, or in a proportion higher than that in the stoichiometric composition i.e., the oxide semiconductor layer can be supersaturated with oxygen. For example, in the case where the oxide semiconductor film is an IGZO film in which the stoichiometric composition is In:Ga:Zn:O=1:1:1:4 [atomic ratio], the atomic ratio of oxygen contained in the IGZO film is larger than 4.

The oxide semiconductor film which contains oxygen sufficiently and is highly purified has a band gap of about 2.8 eV to 3.2 eV, has extremely few minority carriers having a density of about $1\times10^{-9}$/cm³. Majority carriers come only from a source of the transistor. Accordingly, in the transistor using the oxide semiconductor film, an avalanche breakdown does not occur.

Further, in the transistor using the oxide semiconductor film, the channel region of the FET is completely depleted by the electric field of the gate electrode; therefore, for example, the off-state current when the channel length is 3 µm and the channel width is 1 µm can be suppressed to be less than or equal to $1\times10^{-23}$ A at 85° C. to 95° C. and to be less than or equal to $1\times10^{-25}$ A at a room temperature.

The second conductive film 116a and the third conductive film 126a at least partly serve as a source electrode and a drain electrode of the transistor using the first oxide semiconductor film 106a. As the second conductive film 116a and the third conductive film 126a, a film selected from the conductive films given as examples of the first conductive film 104a may be used.

The third insulating film 110a at least partly serves as a gate insulating film. As the third insulating film 110a, a film selected from the insulating films given as examples of the second insulating film 112a may be used.

The fourth conductive film 114 serves as a second gate electrode in the transistor using the first oxide semiconductor film 106a. As the fourth conductive film 114, a film selected from the conductive films given as examples of the first conductive film 104a may be used.

Note that formation of a channel in the first oxide semiconductor film 106a depends on the balance between voltage applied to the fourth conductive film 114 and voltage applied to the first conductive film 104a. For example, when negative voltage is applied to the fourth conductive film 114, even when voltage corresponding to the threshold voltage (Vth) of the transistor is applied to the first conductive film 104a, a channel is not formed in the first oxide semiconductor film 106a. In this case, when voltage which is higher than the threshold voltage (Vth) of the transistor by the negative voltage applied to the fourth conductive film 114 is applied to the first conductive film 104a, a channel is formed. The same can be said to the case where the fourth conductive film 114 and the first conductive film 104a are replaced with each other. Needless to say, the balance between voltage applied to the first gate electrode and voltage applied to the second gate electrode varies depending on the thickness or the dielectric constant of the gate insulating film.

Accordingly, in the case where the transistor has normally-on characteristics (the threshold voltage Vth is negative), negative voltage is sufficiently applied to the first conductive film 104a or the fourth conductive film 114 so that the threshold voltage can be positive, whereby the transistor can have normally-off characteristics (the threshold voltage Vth is positive). It is preferable that the threshold voltage Vth of the transistor be controlled by the fourth conductive film 114.

The fourth insulating film 120a serves as a planarization film. Accordingly, the films provided above the fourth insulating film 120a are less likely to be affected by unevenness generated by the films provided below the fourth insulating film 120a. Thus, a decrease in withstand voltage, disconnection, or the like, which is caused by the unevenness, can be prevented. In other words, the fourth insulating film 120a is an insulating film having a function of reducing the unevenness of the semiconductor device. Note that in the case where unevenness generated by the films provided below the fourth insulating film 120a is minor, the fourth insulating film 120a is not necessarily provided.

The fourth insulating film 120a may be formed of a single layer or a stacked layer of an insulating film(s) containing any of aluminum oxide, aluminum nitride, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide.

The fourth insulating film 120a may also be formed using an organic resin such as acrylic, epoxy, or polyimide. An organic resin can be formed by a spin coating method or the like, and thus a relatively planar upper surface is easily obtained.

The fifth insulating film 110b at least partly serves as a gate insulating film. As the fifth insulating film 110b, a film selected from the insulating films given as examples of the second insulating film 112a may be used.

The second oxide semiconductor film 106b includes a channel region in a region which overlaps with the seventh conductive film 104b. As the second oxide semiconductor film 106b, a film selected from the compound films given as examples of the first oxide semiconductor film 106a may be used.

The fifth conductive film 116b and the sixth conductive film 126b at least partly serve as a source electrode and a drain electrode in a transistor using the second oxide semiconductor film 106b. As the fifth conductive film 116b and the sixth conductive film 126b, a film selected from the conductive films given as examples of the first conductive film 104a may be used.

The sixth insulating film 112b serves as a gate insulating film. As the sixth insulating film 112b, a film selected from the insulating films given as examples of the second insulating film 112a may be used.

The seventh conductive film 104b at least partly serves as a first gate electrode in the transistor using the second oxide semiconductor film 106b. As the seventh conductive film 104b, a film selected from the conductive films given as examples of the first conductive film 104a may be used.

Note that formation of a channel in the second oxide semiconductor film 106b depends on the balance between voltage applied to the fourth conductive film 114 and voltage applied to the seventh conductive film 104b. For example, when negative voltage is applied to the fourth conductive film 114, even when voltage corresponding to the threshold voltage Vth of the transistor is applied to the seventh conductive film 104b, a channel is not formed in the second oxide semiconductor film 106b. In this case, when voltage which is higher than the threshold voltage Vth of the transistor by the negative voltage applied to the fourth conductive film 114 is applied to the seventh conductive film 104b, a channel is formed. The same can be said to the case where the fourth conductive film 114 and the seventh conductive film 104b are replaced with each other.

Accordingly, in the case where the transistor has normally-on characteristics, negative voltage is sufficiently applied to the seventh conductive film 104b or the fourth conductive film 114 so that the threshold voltage Vth can be positive, whereby the transistor can have normally-off characteristics.

Thus, the threshold voltage Vth of the first oxide semiconductor film 106a and the second oxide semiconductor film 106b can be controlled by the fourth conductive film 114. In other words, one second gate electrode (here, the fourth conductive film 114) serves as the second gate electrode both for the transistor using the first oxide semiconductor film 106a and the transistor using the second oxide semiconductor film 106b. Accordingly, the second gate electrode can be shared between the transistors of the semiconductor device, each including gate electrodes above and below its oxide semiconductor layer.

Note that the seventh insulating film 120b serves as a planarization film. Accordingly, films provided above the seventh insulating film 120b are less likely to be affected by unevenness generated by the films provided below the seventh insulating film 120b. Thus, a decrease in withstand voltage, disconnection, or the like, which is caused by the unevenness, can be prevented. In other words, the seventh insulating film 120b is an insulating film having a function of reducing the unevenness of the semiconductor device.

The seventh insulating film 120b enables a stack of the plurality of structures of the semiconductor device described in this embodiment (here, the structure including the components from the first insulating film 102 to the seventh insulating film 120b). Specifically, the number of the structures which are stacked is 2 or more and 10 or less, preferably 3 or more and 20 or less, more preferably 5 or more and 50 or less. Needless to say, the number of the structures which are stacked may be set beyond 50.

In the case where the plurality of structures of the semiconductor device described in this embodiment are stacked, one conductive film serving as the second gate electrode is provided per two transistors. Accordingly, the number of steps for forming second gate electrodes can be reduced. In other words, one conductive film serving as a second gate electrode can be omitted per structure. Thus, in the case where the plurality of structures are provided so as to be stacked, breaking due to stress during manufacture of the semiconductor device can be suppressed, so that a semiconductor device including more transistors can be manufactured. In other words, the semiconductor device can be highly integrated and the yield can be improved.

Next, a method for manufacturing the semiconductor device illustrated in FIG. 1B will be described with reference to FIGS. 2A to 2D, FIGS. 3A to 3C, FIGS. 4A to 4C, FIGS. 5A and 5B, and FIGS. 6A and 6B.

First, the substrate 101 is prepared.

Figure 2A:
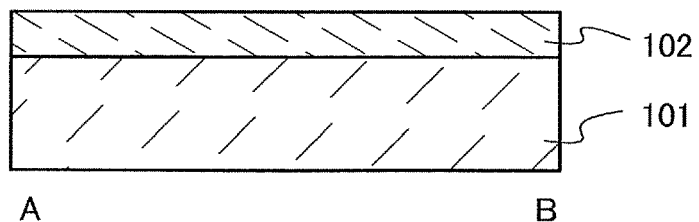
FIGS. 2A to 2D are cross-sectional views illustrating a method for manufacturing a semiconductor device of one embodiment of the present invention.

Next, the first insulating film 102 is formed over the substrate 101 (see FIG. 2A). The first insulating film 102 can be formed by a sputtering method, a chemical vapor deposition (CVD) method, a molecular beam epitaxy (MBE) method, an atomic layer deposition (ALD) method, or a pulsed laser deposition (PLD) method, for example.

Figure 2B:
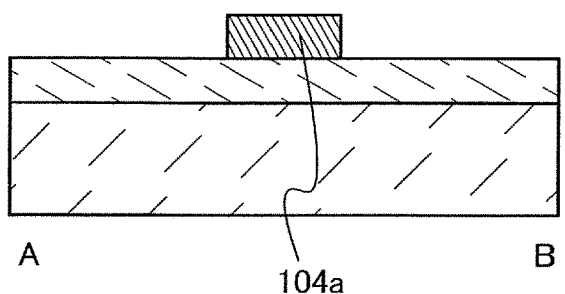

Next, a conductive film is formed and processed to form the first conductive film 104a (see FIG. 2B). The conductive film may be formed by a sputtering method, a CVD method, an MBE method, an ALD method, or a PLD method, for example.

Note that the simple term "processed" means in this specification that the film is formed into a desired shape using a resist mask formed by a photolithography process, for example.

Figure 2C:
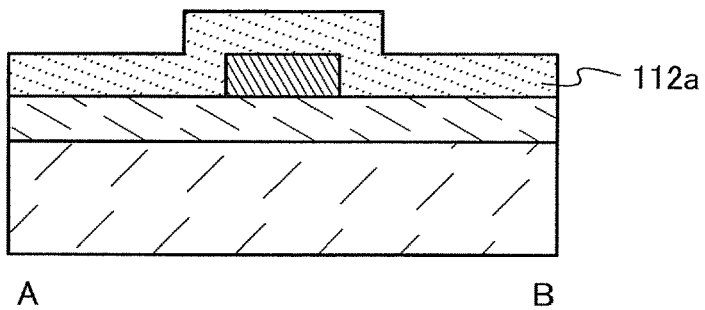

Next, the second insulating film 112a is formed (see FIG. 2C). The second insulating film 112a can be formed by a sputtering method, a CVD method, an MBE method, an ALD method, or a PLD method, for example.

Figure 2D:
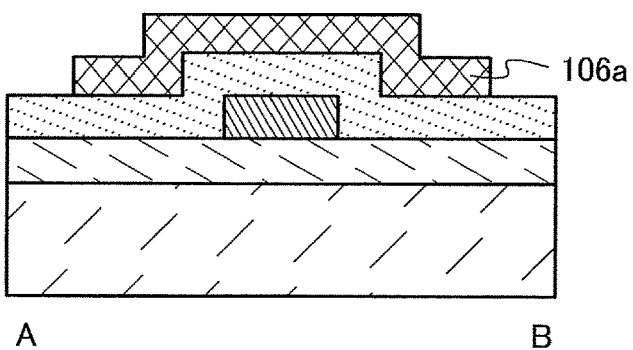

Next, an oxide semiconductor film is formed and then processed to form the first oxide semiconductor film 106a (see FIG. 2D). The oxide semiconductor film may be formed by a sputtering method, a CVD method, an MBE method, an ALD method, or a PLD method, for example.

Figure 3A:
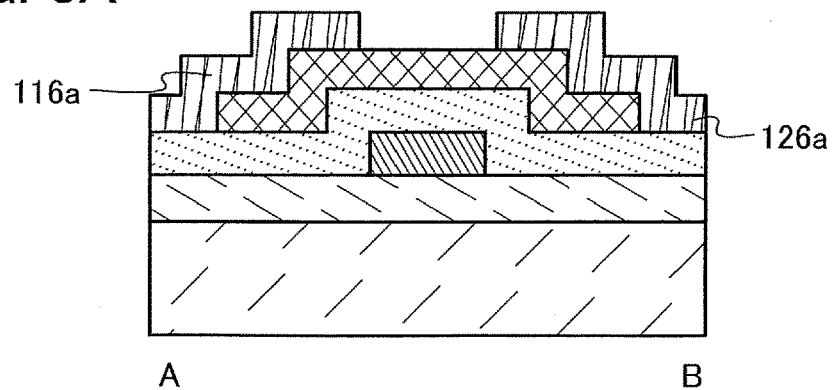
FIGS. 3A to 3C are cross-sectional views illustrating a method for manufacturing the semiconductor device of one embodiment of the present invention.

Next, a conductive film is formed and then processed to form the second conductive film 116a and the third conductive film 126a (see FIG. 3A). The conductive film may be formed by a sputtering method, a CVD method, an MBE method, an ALD method, or a PLD method, for example.

Figure 3B:
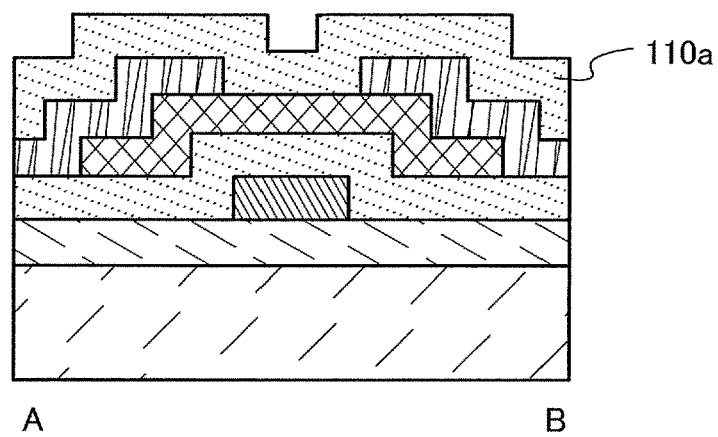

Then, the third insulating film 110a is formed (see FIG. 3B). The third insulating film 110a can be formed by a sputtering method, a CVD method, an MBE method, an ALD method, or a PLD method, for example.

Figure 3C:
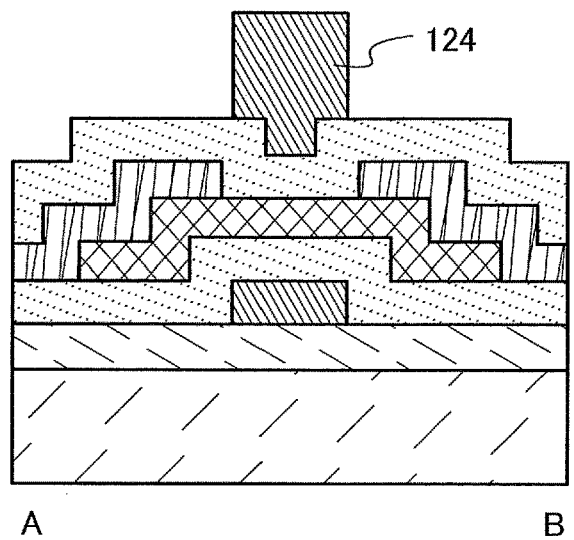

Next, a conductive film is formed and then processed to form a conductive film 124 (see FIG. 3C). The conductive film may be formed by a sputtering method, a CVD method, an MBE method, an ALD method, or a PLD method, for example.

Figure 4A:
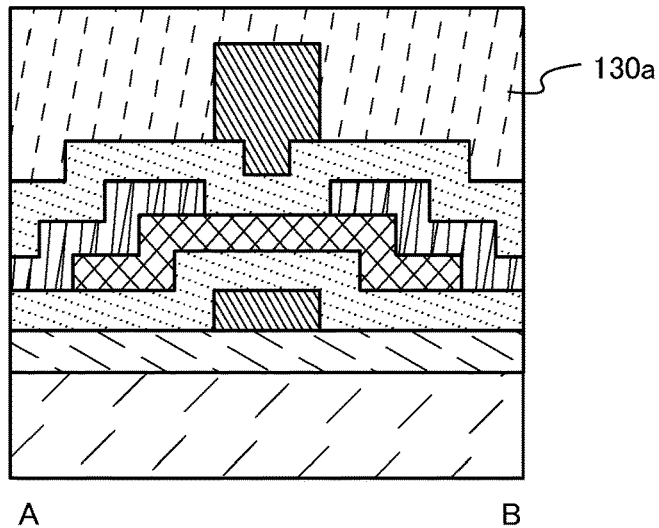
FIGS. 4A to 4C are cross-sectional views illustrating a method for manufacturing the semiconductor device of one embodiment of the present invention.

Next, an insulating film 130a is formed (see FIG. 4A). The insulating film 130a may be formed by a spin coating method, a sputtering method, a CVD method, an MBE method, an ALD method, or a PLD method, for example.

Figure 4B:
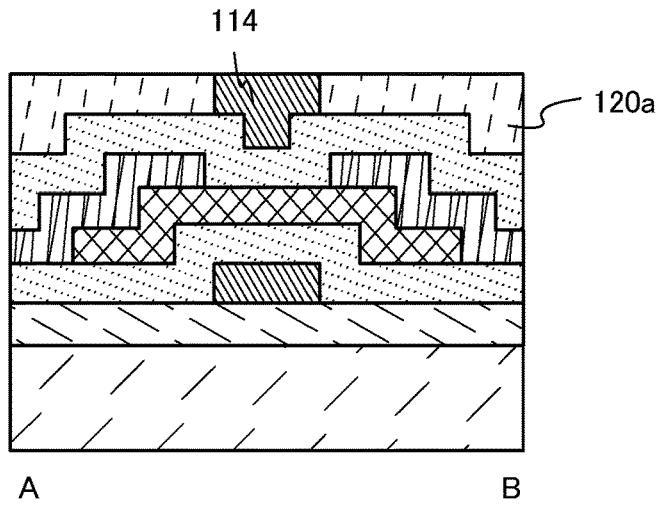

Next, the insulating film 130a and the conductive film 124 are removed from the upper surfaces so that they have planarity, so that the fourth insulating film 120a and the fourth conductive film 114 whose upper surfaces are level with each other are formed (see FIG. 4B). Note that the insulating film 130a and the conductive film 124 are formed to have a sufficient thickness in advance, which makes it easy to form the fourth insulating film 120a and the fourth conductive film 114 whose upper surfaces are level with each other.

As a method for removing the insulating film 130a and the conductive film 124 from the upper surfaces so that they have planarity, a chemical mechanical polishing (CMP) method may be used, for example.

Figure 4C:
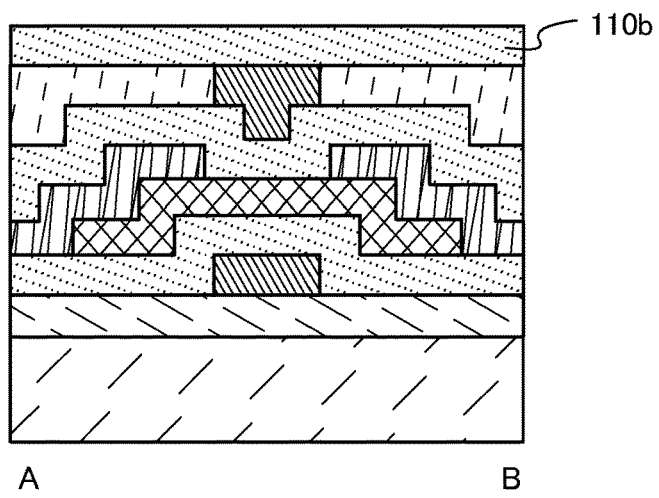

Then, the fifth insulating film 110b is formed (see FIG. 4C). The fifth insulating film 110b may be formed by a sputtering method, a CVD method, an MBE method, an ALD method, or a PLD method, for example.

Figure 5A:
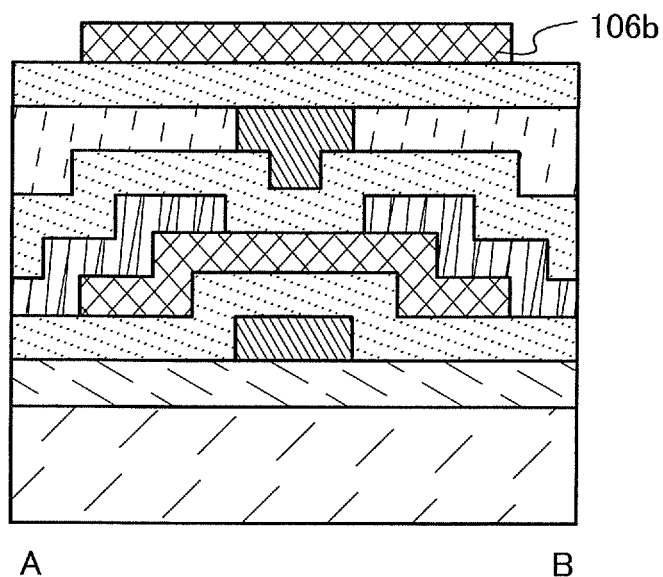
FIGS. 5A and 5B are cross-sectional views illustrating a method for manufacturing the semiconductor device of one embodiment of the present invention.

Next, an oxide semiconductor film is formed and then processed to form the second oxide semiconductor film 106b (see FIG. 5A). The oxide semiconductor film may be formed by a sputtering method, a CVD method, an MBE method, an ALD method, or a PLD method, for example.

Figure 5B:
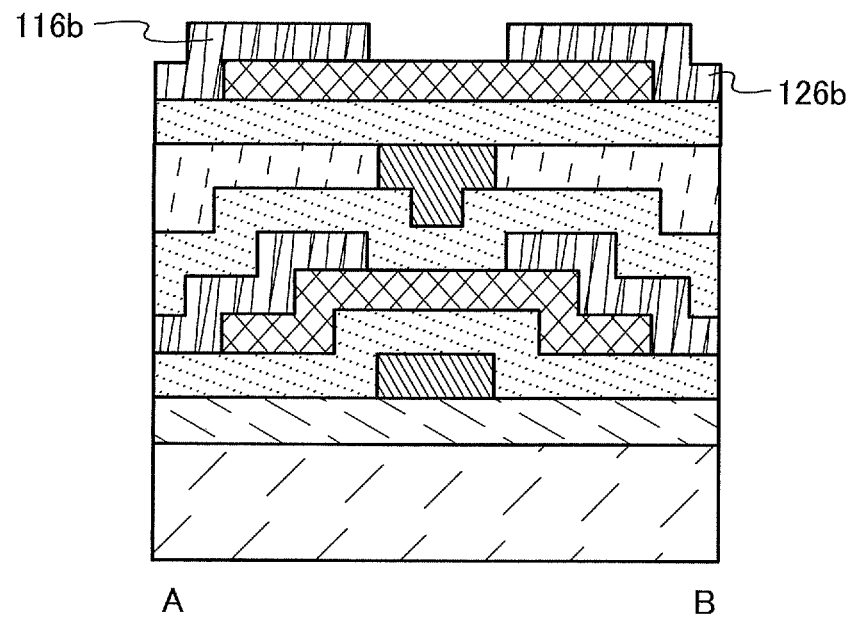

Next, a conductive film is formed and then processed to form the fifth conductive film 116b and the sixth conductive film 126b (see FIG. 5B). The conductive film may be formed by a sputtering method, a CVD method, an MBE method, an ALD method, or a PLD method, for example.

Figure 6A:
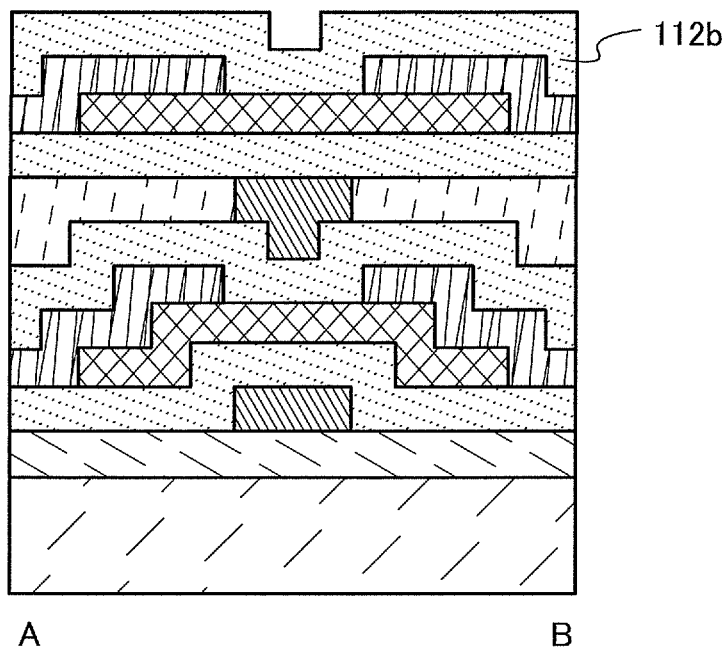
FIGS. 6A and 6B are cross-sectional views illustrating a method for manufacturing the semiconductor device of one embodiment of the present invention.

Next, the sixth insulating film 112b is formed (see FIG. 6A). The sixth insulating film 112b may be formed by a sputtering method, a CVD method, an MBE method, an ALD method, or a PLD method, for example.

Figure 6B:
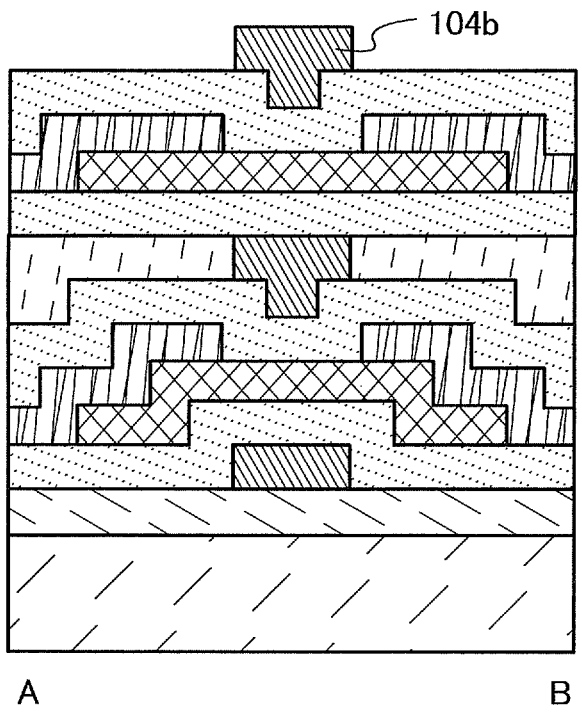

Next, a conductive film is formed and then processed to form the seventh conductive film 104b (see FIG. 6B). The conductive film may be formed by a sputtering method, a CVD method, an MBE method, an ALD method, or a PLD method, for example.

Next, the seventh insulating film 120b is formed. In this manner, the semiconductor device illustrated in FIG. 1B is manufactured. The seventh insulating film 120b may be formed by a spin coating method, a sputtering method, a CVD method, an MBE method, an ALD method, or a PLD method, for example.

Note that in order to planarize an upper surface of the seventh insulating film 120b, CMP or the like may be performed thereon.

Note that in a step before or after any of the respective processings for forming the first oxide semiconductor film 106a and the second oxide semiconductor film 106b, heat treatment may be performed at a temperature higher than or equal to 100° C. and lower than or equal to 450° C., preferably higher than or equal to 150° C. and lower than or equal to 400° C., more preferably higher than or equal to 200° C. and lower than or equal to 350° C. Further, when the oxide semiconductor film serving as the first oxide semiconductor film 106a or the second oxide semiconductor film 106b is formed, the substrate temperature may be higher than or equal to 100° C. and lower than or equal to 450° C., preferably higher than or equal to 150° C. and lower than or equal to 400° C., more preferably higher than or equal to 200° C. and lower than or equal to 350° C. By the heat treatment and/or the formation method, hydrogen, halogen, a metal element which is not a main component, an oxygen vacancy, or the like in the first oxide semiconductor film 106a or the second oxide semiconductor film 106b can be reduced, so that a semiconductor device having excellent characteristics and high reliability can be manufactured.

Figure 17A:
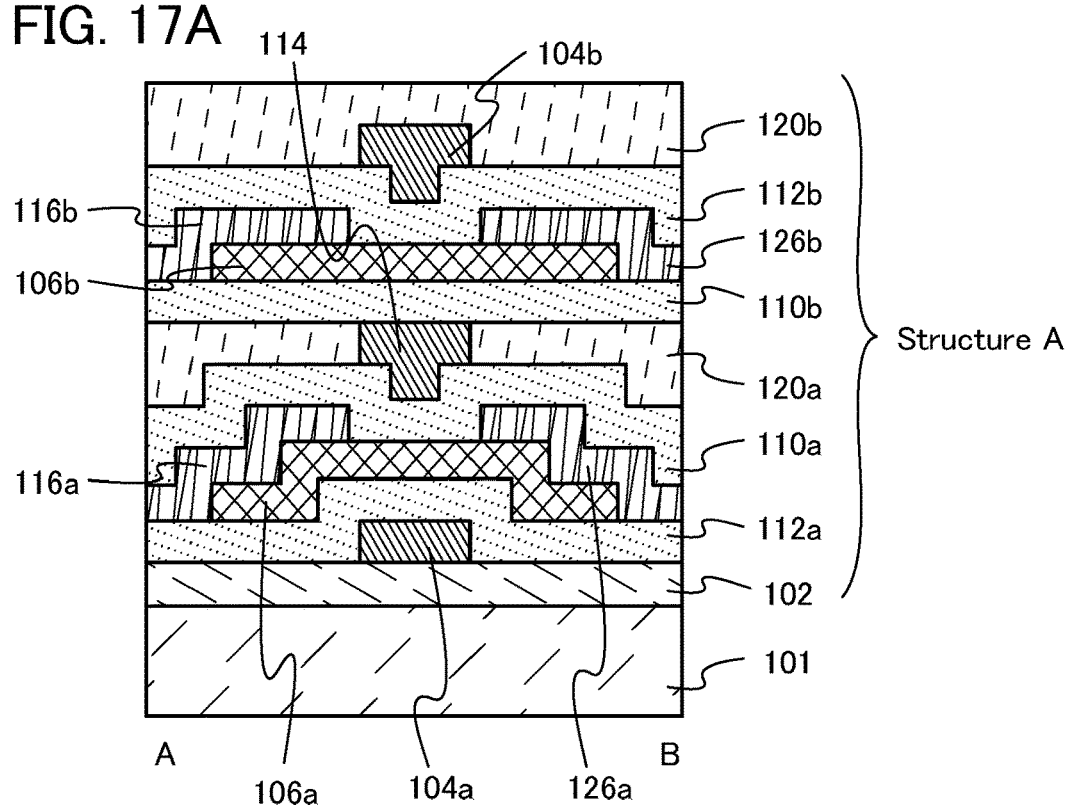
FIGS. 17A and 17B are cross-sectional views illustrating an example of a semiconductor device of one embodiment of the present invention.
Figure 17B:
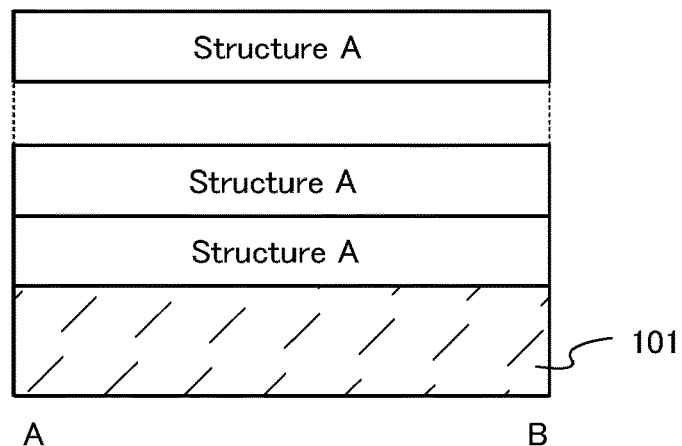

Since the semiconductor device manufactured as described above has a planar upper surface, a plurality of structures similar to the structure of the semiconductor device can be provided so as to be stacked. For example, when a structure including the components from the first insulating film 102 to the seventh insulating film 120b in FIG. 17A is referred to as A structure (this structure corresponds to the structure in FIG. 1B), the plurality of A structures may be stacked as illustrated in FIG. 17B. Accordingly, the degree of integration of the semiconductor device can be increased. Further, the number of the layers for forming the second gate electrodes in the transistors each including gate electrodes above and below the oxide semiconductor layer can be made small, and thus stress can be prevented from being increased even when the plurality of structures similar to the structure of the semiconductor device are stacked. In other words, even when the degree of integration of the semiconductor device is increased, the yield of the semiconductor device is not decreased.

This embodiment can be implemented in appropriate combination with any of the other embodiments.

Embodiment 2

In this embodiment, a semiconductor device having a structure different from that of the semiconductor device in Embodiment 1 will be described with reference to FIGS. 7A and 7B, FIG. 8, FIGS. 9A to 9D, FIGS. 10A to 10C, FIGS. 11A to 11C, FIGS. 12A and 12B, FIGS. 13A and 13B, FIGS. 14A and 14B, and FIG. 15.

Figure 7A:
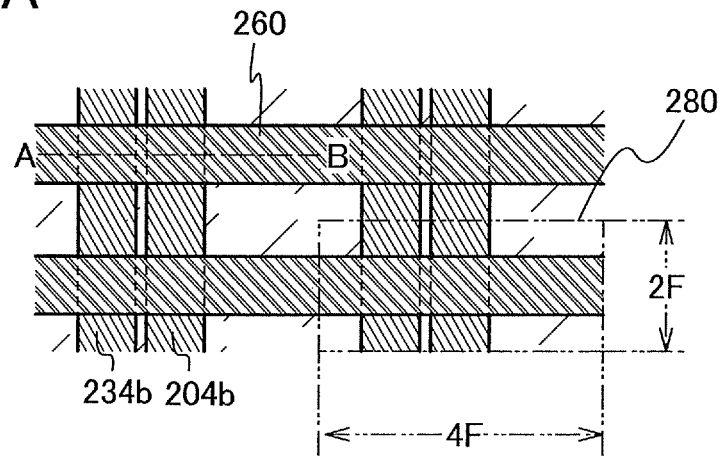
FIGS. 7A and 7B are a top view and a cross-sectional view, respectively, illustrating an example of a semiconductor device of one embodiment of the present invention.
Figure 7B:
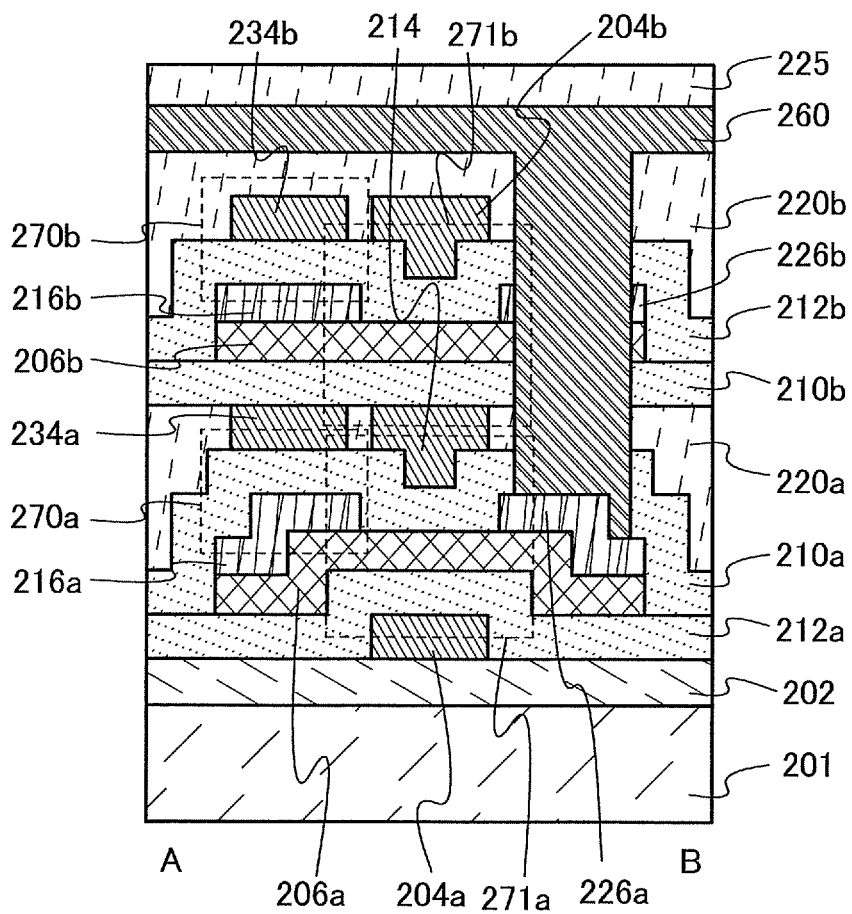

FIG. 7A is a top view of a semiconductor device of one embodiment of the present invention. Note that FIG. 7B is a cross-sectional view taken along dashed-dotted line A-B in FIG. 7A. In FIG. 7A, a film which is not seen due to overlap, an insulating film, and the like, are omitted for simplicity.

The semiconductor device illustrated in FIG. 7B includes a first conductive film 204a provided over a first insulating film 202 which is provided over a substrate 201; a second insulating film 212a provided over the first conductive film 204a and the first insulating film 202; a first oxide semiconductor film 206a which is provided over the second insulating film 212a and at least partly overlaps with the first conductive film 204a; a second conductive film 216a and a third conductive film 226a which are provided over the first oxide semiconductor film 206a; a third insulating film 210a provided over the second conductive film 216a, the third conductive film 226a, and the first oxide semiconductor film 206a; a fourth conductive film 234a which is provided over the third insulating film 210a and at least partly overlaps with the second conductive film 216a; a fifth conductive film 214 which is provided over the third insulating film 210a and at least partly overlaps with the first oxide semiconductor film 206a and the first conductive film 204a; a fourth insulating film 220a which is provided over the third insulating film 210a and whose upper surface is level with upper surfaces of the fourth conductive film 234a and the fifth conductive film 214; a fifth insulating film 210b provided over the fourth conductive film 234a, the fifth conductive film 214, and the fourth insulating film 220a; a second oxide semiconductor film 206b which is provided over the fifth insulating film 210b and at least partly overlaps with the fifth conductive film 214; a sixth conductive film 216b which is provided over the second oxide semiconductor film 206b and at least partly overlap with the second conductive film 216a; a seventh conductive film 226b which is provided over the second oxide semiconductor film 206b and at least partly overlap with the third conductive film 226a; a sixth insulating film 212b provided over the sixth conductive film 216b, the seventh conductive film 226b, and the second oxide semiconductor film 206b; an eighth conductive film 234b which is provided over the sixth insulating film 212b and at least partly overlaps with the sixth conductive film 216b; a ninth conductive film 204b which is provided over the sixth insulating film 212b and at least partly overlaps with the second oxide semiconductor film 206b and the fifth conductive film 214; a seventh insulating film 220b provided over the eighth conductive film 234b, the ninth conductive film 204b, and the sixth insulating film 212b; and a tenth conductive film 260 provided over the seventh insulating film 220b. Note that an opening reaching the third conductive film 226a is formed in the seventh insulating film 220b, the sixth insulating film 212b, the seventh conductive film 226b, the second oxide semiconductor film 206b, the fifth insulating film 210b, the fourth insulating film 220a, and the third insulating film 210a. The tenth conductive film 260 and the third conductive film 226a are in contact with each other through the opening. Note that an eighth insulating film 225 having a planar upper surface is preferably provided over the tenth conductive film 260 and the seventh insulating film 220b.

Here, the description of the substrate 101 can be referred to for the substrate 201. The description of the first insulating film 102 can be referred to for the first insulating film 202. The description of the first conductive film 104a can be referred to for the first conductive film 204a. The description of the second insulating film 112a can be referred to for the second insulating film 212a. The description of the first oxide semiconductor film 106a can be referred to for the first oxide semiconductor film 206a. The description of the second conductive film 116a can be referred to for the second conductive film 216a. The description of the third conductive film 126a can be referred to for the third conductive film 226a. The description of the third insulating film 110a can be referred to for the third insulating film 210a. The description of the fourth conductive film 114 can be referred to for the fifth conductive film 214. The description of the fourth insulating film 120a can be referred to for the fourth insulating film 220a. The description of the fifth insulating film 110b can be referred to for the fifth insulating film 210b. The description of the second oxide semiconductor film 106b can be referred to for the second oxide semiconductor film 206b. The description of the fifth conductive film 116b can be referred to for the sixth conductive film 216b. The description of the sixth conductive film 126b can be referred to for the seventh conductive film 226b. The description of the sixth insulating film 112b can be referred to for the sixth insulating film 212b. The description of the seventh conductive film 104b can be referred to for the ninth conductive film 204b. The description of the seventh insulating film 120b can be referred to for the seventh insulating film 220b.

The fourth conductive film 234a is provided in the same layer as the fifth conductive film 214.

The eighth conductive film 234b is provided in the same layer as the ninth conductive film 204b.

The tenth conductive film 260 serves as a bit line of a memory. A side surface of the tenth conductive film 260 is in contact with the seventh conductive film 226b. As the tenth conductive film 260, a film selected from the conductive films given as examples of the second conductive film 216a may be used.

Further, the first conductive film 204a and the ninth conductive film 204b each serve as a word line of the memory.

Furthermore, the fifth conductive film 214 serves as a second gate electrode of a transistor using the first oxide semiconductor film 206a and a transistor using the second oxide semiconductor film 206b.

Figure 8:
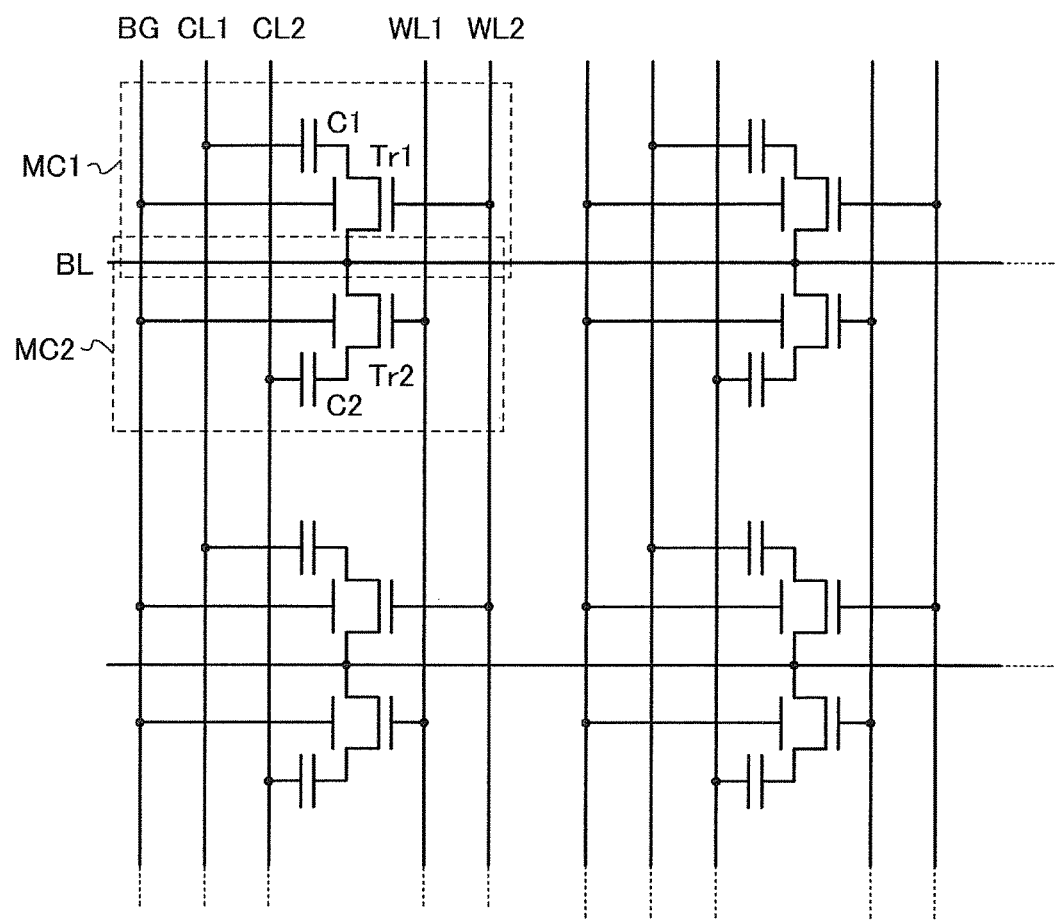
FIG. 8 is a circuit diagram which corresponds to a semiconductor device of one embodiment of the present invention.

In FIG. 8, a circuit diagram of the semiconductor device formed as described above is illustrated. FIG. 8 is a circuit diagram of a memory in which one transistor is provided per capacitor.

When FIG. 7B and FIG. 8 are compared, the first conductive film 204a at least partly serves as a first word line WL1; the fourth conductive film 234a at least partly serves as a first capacitor line CL1; the fifth conductive film 214 at least partly serves as a back gate line BG; the eighth conductive film 234b at least partly serves as a second capacitor line CL2; the ninth conductive film 204b at least partly serves as a second word line WL2; and the tenth conductive film 260 at least partly serves as a bit line BL.

Further, a capacitor C1 in FIG. 8 corresponds to a capacitor 270a in FIG. 7B. The capacitor 270a includes at least part of the second conductive film 216, at least part of the third insulating film 210a, and at least part of the fourth conductive film 234a. A capacitor C2 in FIG. 8 corresponds to a capacitor 270b in FIG. 7B. The capacitor 270b includes at least part of the sixth conductive film 216b, at least part of the sixth insulating film 212b, and at least part of the eighth conductive film 234b.

A transistor Tr1 in FIG. 8 corresponds to a transistor 271a in FIG. 7B. The transistor 271a includes at least part of the first conductive film 204a, at least part of the first oxide semiconductor film 206a, at least part of the second conductive film 216a, at least part of the third conductive film 226a, and at least part of the fifth conductive film 214. A transistor Tr2 in FIG. 8 corresponds to a transistor 271b in FIG. 7B. The transistor 271b includes at least part of the ninth conductive film 204b; at least part of the second oxide semiconductor film 206b; at least part of the sixth conductive film 216b; at least part of the seventh conductive film 226b; and at least part of the fifth conductive film 214.

A memory cell MC1 includes the transistor Tr1 and the capacitor C1. A memory cell MC2 includes the transistor Tr2 and the capacitor C2.

Note that the memory cell MC1 and the memory cell MC2 are provided so as to at least partly overlap with each other. Here, in FIG. 7A, the area of a memory cell 280 is 2F×4F, that is 8F$^2$. However, the memory cell MC1 and the memory cell MC2 are provided in the area. Accordingly, in the case where the memory cell MC1 and the memory cell MC2 completely overlap with each other, the area per memory cell can be regarded as 4F$^2$, which is a half of 8F$^2$.

Note that the semiconductor device illustrated in FIG. 7B includes the eighth insulating film 225 having a planar upper surface as an uppermost layer. Therefore, a plurality of structures similar to the structure of the semiconductor device in FIG. 7B can be provided so as to be stacked. In the case where two structures of the semiconductor device in FIG. 7B are stacked and four memory cells are provided so as to completely overlap with each other in an area of 8 F$^2$, the area per memory can be regarded as 2F$^2$, which is one-quarter of 8F$^2$.

As described above, when the plurality of structures of the semiconductor device in FIG. 7B are provided so as to be stacked, the area per memory cell can be reduced, so that a memory having large storage capacity per unit area can be manufactured. Further, the yield of the semiconductor device is not decreased even when the degree of integration of the semiconductor device is increased.

Note that although FIG. 8 is a circuit diagram showing part of the memory, the scale can be expanded, so that a memory cell array in which a plurality of memory cells MC1 and memory cells MC2 are arranged in the same plane can be obtained.

Methods for wiring and reading data to/from the memory cell array will be described below.

A method for writing data to the memory cell array will be described. Data writing is performed on every memory cell. Specifically, a potential of the word line in a row which is selected arbitrarily is set to VH (potential higher than the sum of the threshold voltage (Vth) of a transistor and VDD (power supply potential)), and potentials of word lines in the other rows are set to GND (or lower than GND). Next, a potential of a bit line in a column which is selected arbitrarily is set to VDD, and the bit lines in the other columns are set to a floating potential (float). As a result, VDD is stored in a capacitor which is in a memory cell in the selected row and which is connected to the bit line in the selected column. Then, the potential of the word line in the selected row is set to GND (or lower than GND), whereby data is stored in the memory cell. After that, data is sequentially written to other memory cells. This is the method for wiring data to the memory cell array.

Alternatively, data writing is performed per row. For example, to write data to the memory cells at theist row, the potential VH is applied to the word line in the first row, and then, the potential VDD is applied to the bit line at each column of the memory cell(s) to which data 1 is written, whereas the potential GND is applied to the bit line at each column of the memory cell(s) to which data 0 is written. Then, the potential of the word line is changed to GND (or a potential lower than GND), whereby data is held in the capacitor. This operation is performed row by row, whereby data can be written in all memory cells. This is the method for wiring data to the memory cell array.

Low off-state current of the transistor using an oxide semiconductor film, which is one embodiment of the present invention, enables data written to the memory cell in this manner to be stored for a long time.

Then, a method for reading data will be described. Data reading is performed on every memory cell. First, a potential of a bit line in a column which is selected arbitrarily is set to a predetermined potential (fixed potential). Next, a potential of a word line in a row which is selected arbitrarily is set to VH, whereby a potential corresponding to data written to the capacitor is given to the bit line which is selected. After that, the given potential is read by a sense amplifier (not illustrated). Note that data is lost at the same time data is read. However, the operation of the sense amplifier amplifies the potential, so that data is written to the memory cell again. After that, data is sequentially read from other memory cells.

Alternatively, data reading is performed per row. For example, in the case where data in the memory cells in the first row are read, potentials of all the bit lines are set to a predetermined potential (a fixed potential). Next, potentials of the word line in the first row are set to VH, so that the potential of each of the bit lines is changed depending on data. This operation is performed row by row, whereby data can be read out from all the memory cells. This is the method for reading data from the memory cell array.

Here, a method for manufacturing the semiconductor device illustrated in FIG. 7B will be described with reference to FIGS. 9A to 9D, FIGS. 10A to 10C, FIGS. 11A to 11C, FIGS. 12A and 12B, FIGS. 13A and 13B, FIGS. 14A and 14B, and FIG. 15.

First, the substrate 201 is prepared.

Figure 9A:
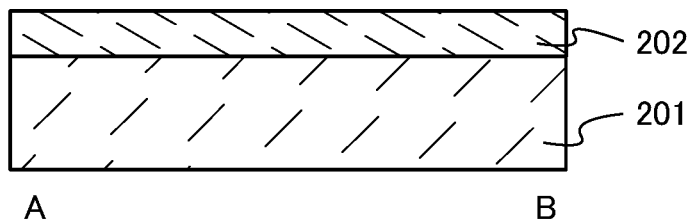
FIGS. 9A to 9D are cross-sectional views illustrating a method for manufacturing a semiconductor device of one embodiment of the present invention.

Next, the first insulating film 202 is formed over the substrate 201 (see FIG. 9A).

Figure 9B:
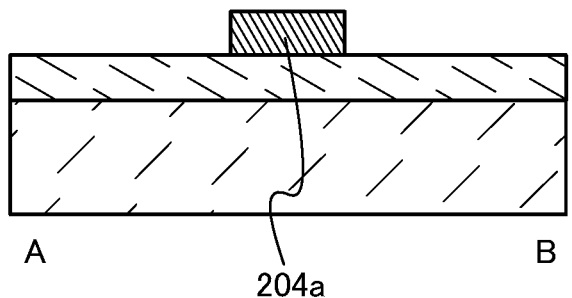

Then, a conductive film is formed and then processed to form the first conductive film 204a (see FIG. 9B).

Figure 9C:
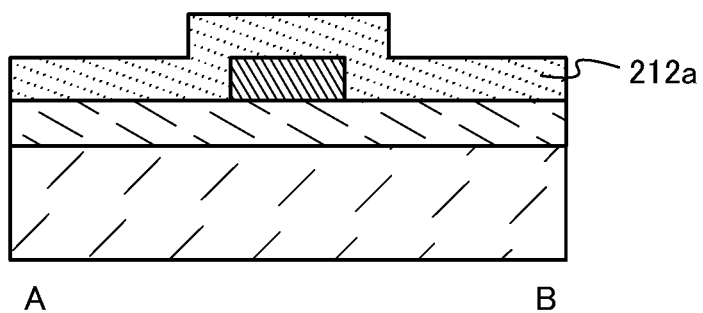

After that, the second insulating film 212a is formed (see FIG. 9C).

Figure 9D:
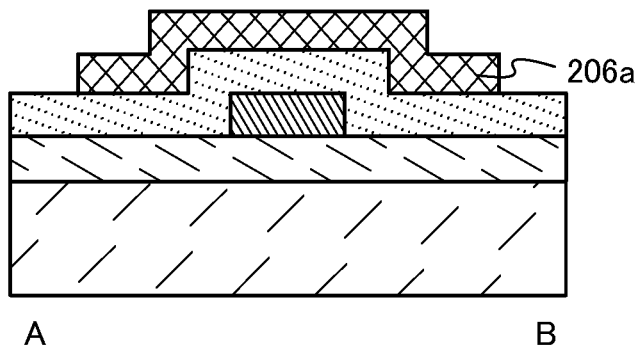

Next, an oxide semiconductor film is formed and then processed, so that the first oxide semiconductor film 206a is formed (see FIG. 9D).

Figure 10A:
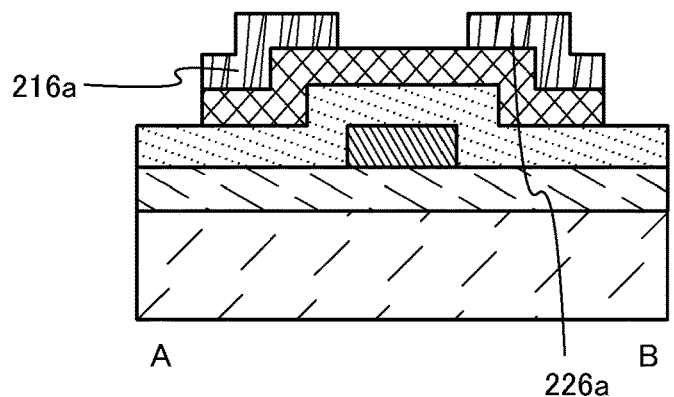
FIGS. 10A to 10C are cross-sectional views illustrating a method for manufacturing the semiconductor device of one embodiment of the present invention.

Subsequently, a conductive film is formed and then processed, so that the second conductive film 216a and the third conductive film 226a are formed (see FIG. 10A).

Figure 10B:
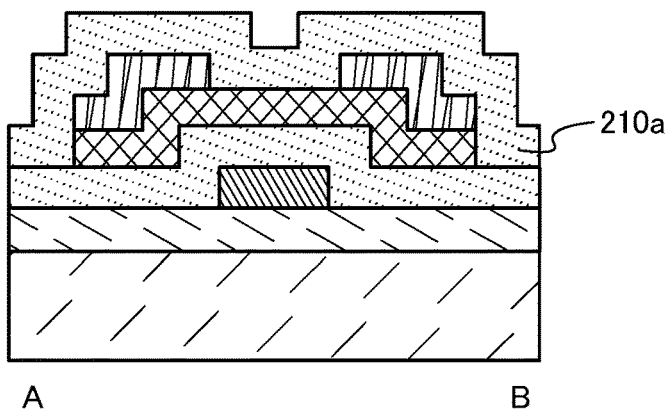

Then, the third insulating film 210a is formed (see FIG. 10B).

Figure 10C:
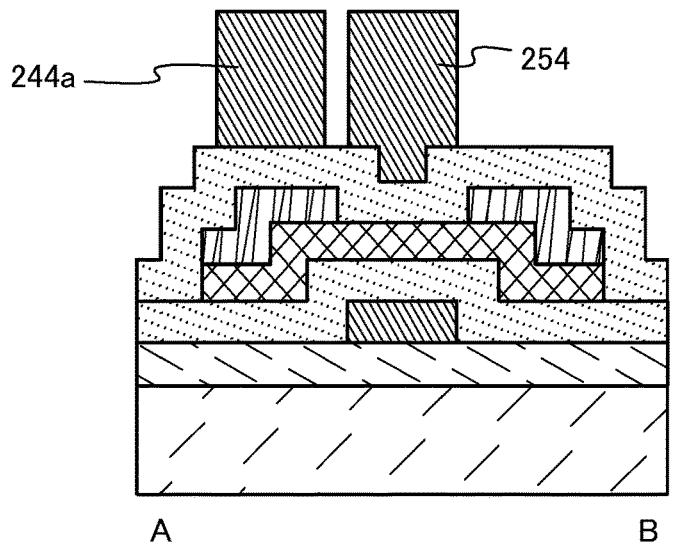

Next, a conductive film is formed and then processed, so that a conductive film 244a and a conductive film 254 are formed (see FIG. 10C).

Figure 11A:
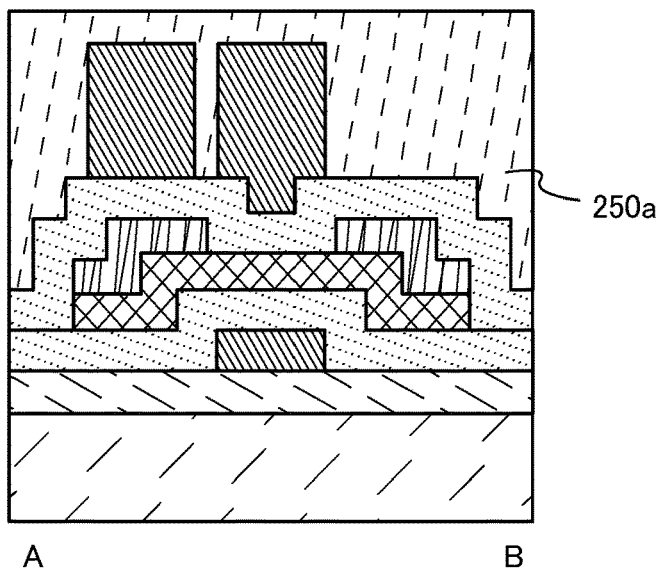
FIGS. 11A to 11C are cross-sectional views illustrating a method for manufacturing the semiconductor device of one embodiment of the present invention.

Next, an insulating film 250a is formed (see FIG. 11A).

Figure 11B:
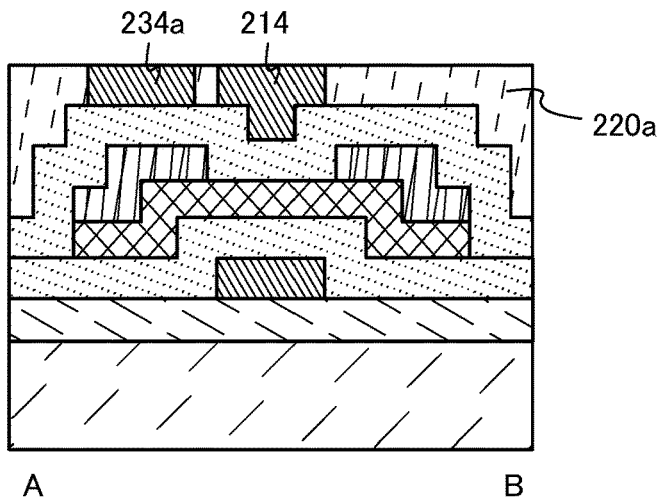

Next, the insulating film 250a, the conductive film 244a, and the conductive film 254 are etched from the upper surfaces by CMP or the like, whereby the fourth insulating film 220a, the fourth conductive film 234a, and the fifth conductive film 214, whose upper surfaces are level with one another, are formed (see FIG. 11B). Note that when the insulating film 250a, the conductive film 244a, and the conductive film 254 are formed to have a sufficient thickness in advance, which makes it easy to form the fourth insulating film 220a, the fourth conductive film 234a, and the fifth conductive film 214, whose upper surfaces are level with one another.

Figure 11C:
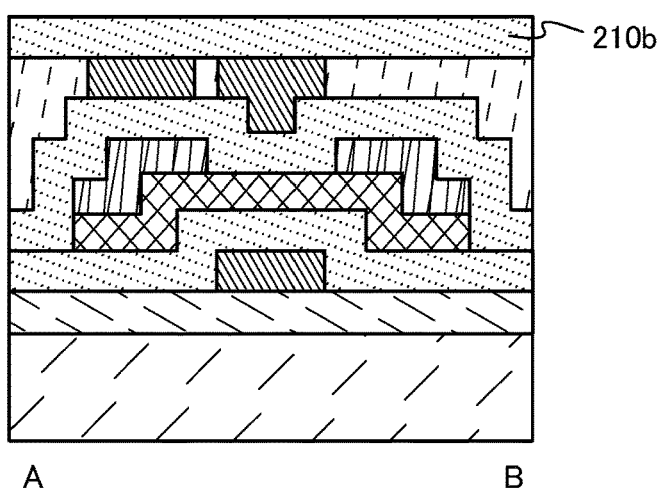

Next, the fifth insulating film 210b is formed (see FIG. 11C).

Figure 12A:
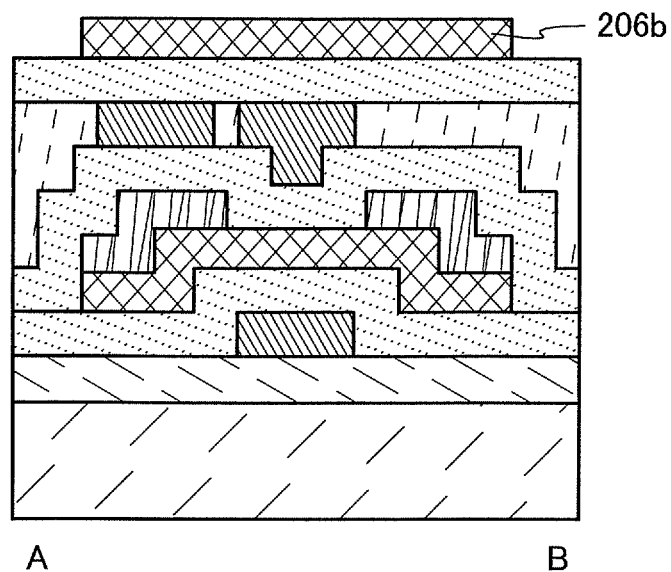
FIGS. 12A and 12B are cross-sectional views illustrating a method for manufacturing the semiconductor device of one embodiment of the present invention.

Next, an oxide semiconductor film is formed and then processed, so that the second oxide semiconductor film 206b is formed (see FIG. 12A).

Figure 12B:
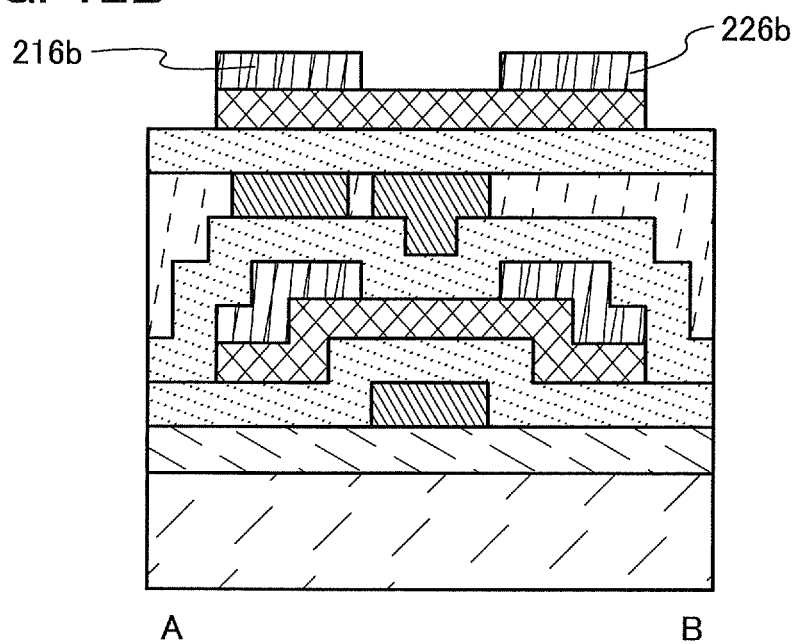

Next, a conductive film is formed and then processed, so that the sixth conductive film 216b and the seventh conductive film 226b are formed (see FIG. 12B).

Figure 13A:
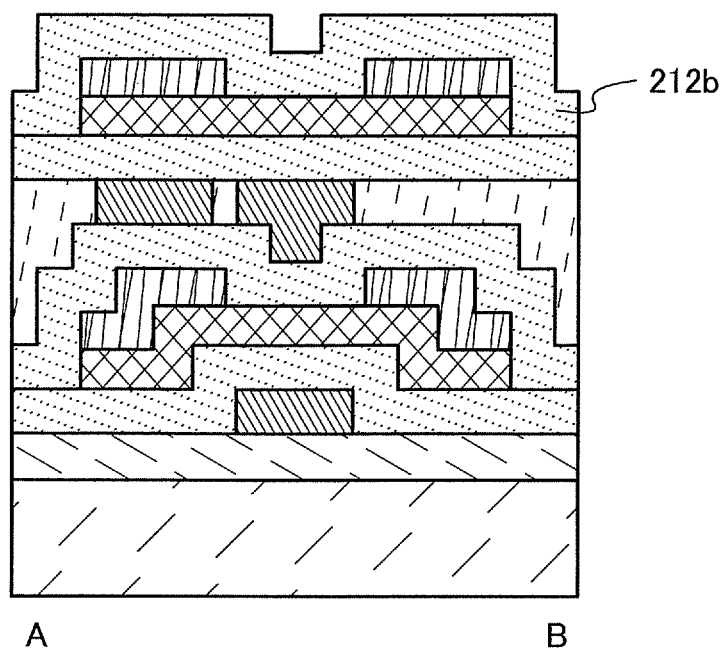
FIGS. 13A and 13B are cross-sectional views illustrating a method for manufacturing the semiconductor device of one embodiment of the present invention.

Next, the sixth insulating film 212b is formed (see FIG. 13A).

Figure 13B:
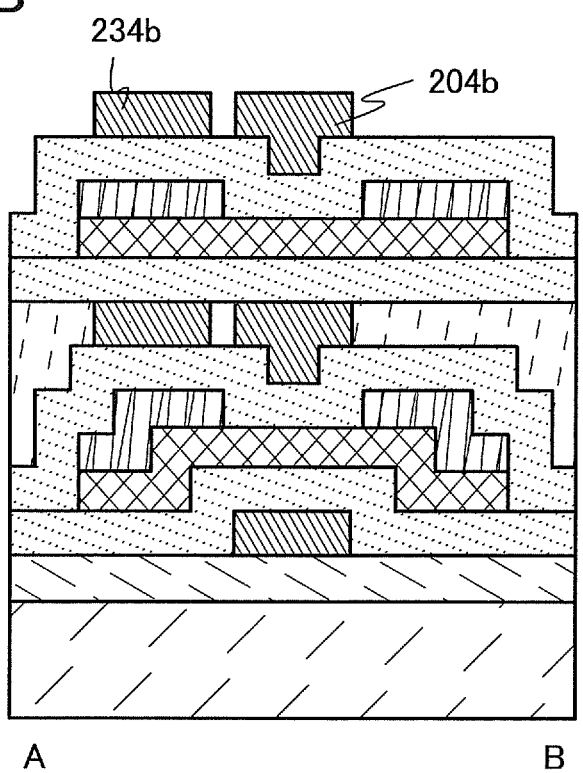

Next, a conductive film is formed and then processed, so that the eighth conductive film 234b and the ninth conductive film 204b are formed (see FIG. 13B).

Figure 14A:
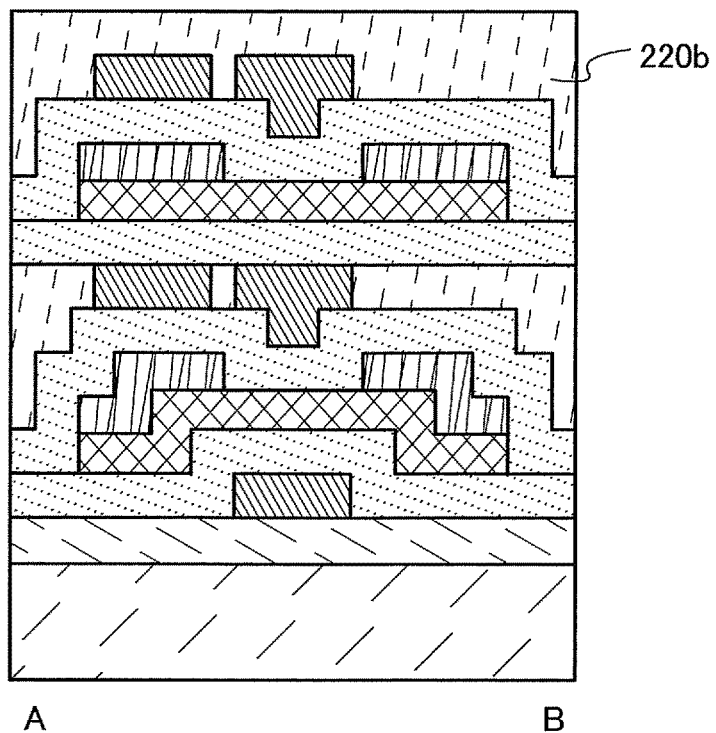
FIGS. 14A and 14B are cross-sectional views illustrating a method for manufacturing the semiconductor device of one embodiment of the present invention.

Next, the seventh insulating film 220b is formed (see FIG. 14A).

Figure 14B:
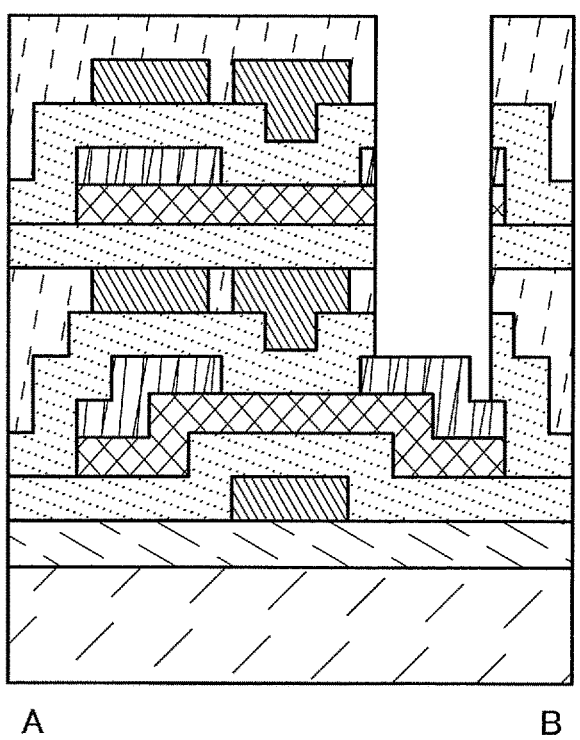

Next, the seventh insulating film 220b, the sixth insulating film 212b, the seventh conductive film 226b, the second oxide semiconductor film 206b, the fifth insulating film 210b, the fourth insulating film 220a, and the third insulating film 210a are each partly etched to form the opening through which the third conductive film 226a is exposed (see FIG. 14B).

Figure 15:
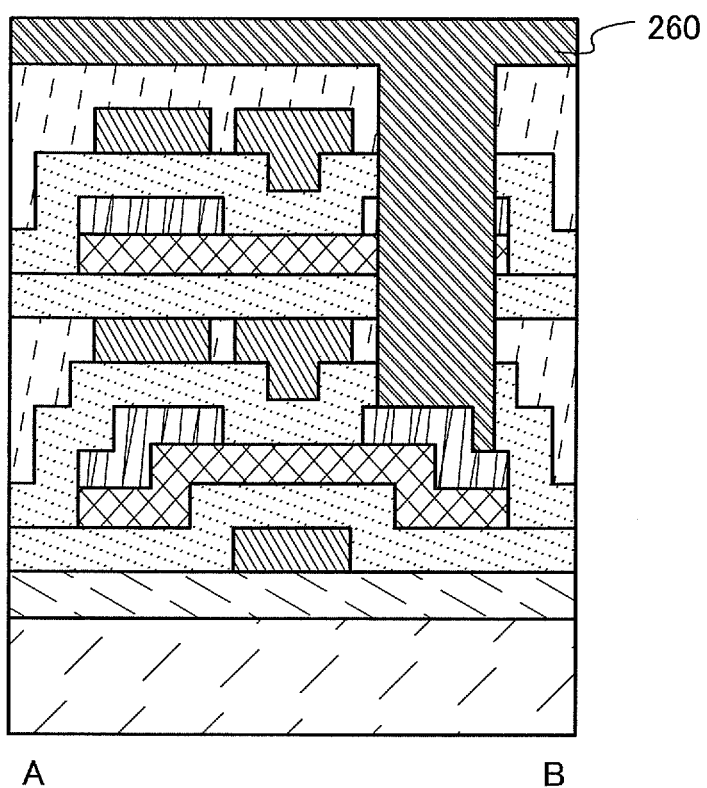
FIG. 15 is a cross-sectional view illustrating a method for manufacturing the semiconductor device of one embodiment of the present invention.

Next, a conductive film is formed and then processed, so that the tenth conductive film 260 is formed (see FIG. 15).

Next, the eighth insulating film 225 is formed. Thus, the semiconductor device illustrated in FIG. 7B is manufactured.

Note that in order to planarize a surface of the eighth insulating film 225, CMP or the like may be performed thereon.

Since the semiconductor device manufactured as described above has a planar upper surface, the plurality of structures similar to the structure of the semiconductor device can be provided so as to be stacked as exemplified in FIG. 17B, so that the degree of integration of the semiconductor device can be increased. Further, the number of the layers used for the second gate electrodes can be reduced, and thus stress can be prevented from being increased even when the plurality of structures similar to the structure of the semiconductor device are stacked. In other words, even when the degree of integration of the semiconductor device is increased, the yield of the semiconductor device is not decreased.

This embodiment can be implemented in appropriate combination with any of the other embodiments.

Embodiment 3

In this embodiment, a semiconductor device having a structure different from those of the semiconductor devices in Embodiments 1 and 2 will be described with reference to FIGS. 16A and 16B.

Figure 16A:
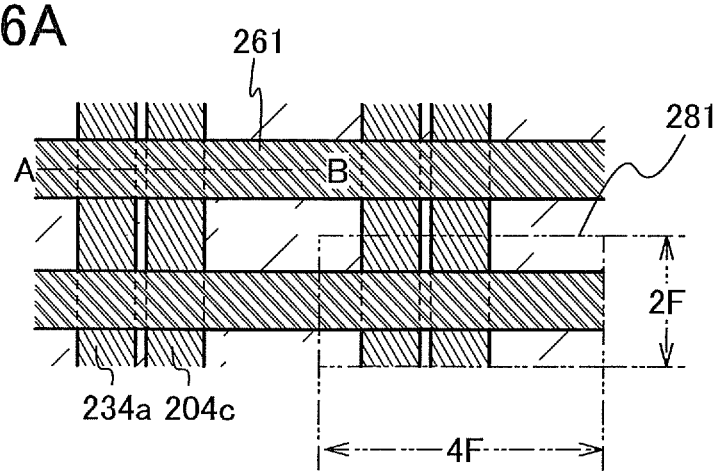
FIGS. 16A and 16B are a top view and a cross-sectional view, respectively, illustrating an example of a semiconductor device of one embodiment of the present invention.

FIG. 16A is a top view of a semiconductor device of one embodiment of the present invention. A cross-sectional view taken along dashed-dotted line A-B in FIG. 16A is FIG. 16B. In FIG. 16A, a film which is not seen due to overlap, an insulating film, and the like, are omitted for simplicity.

Figure 16B:
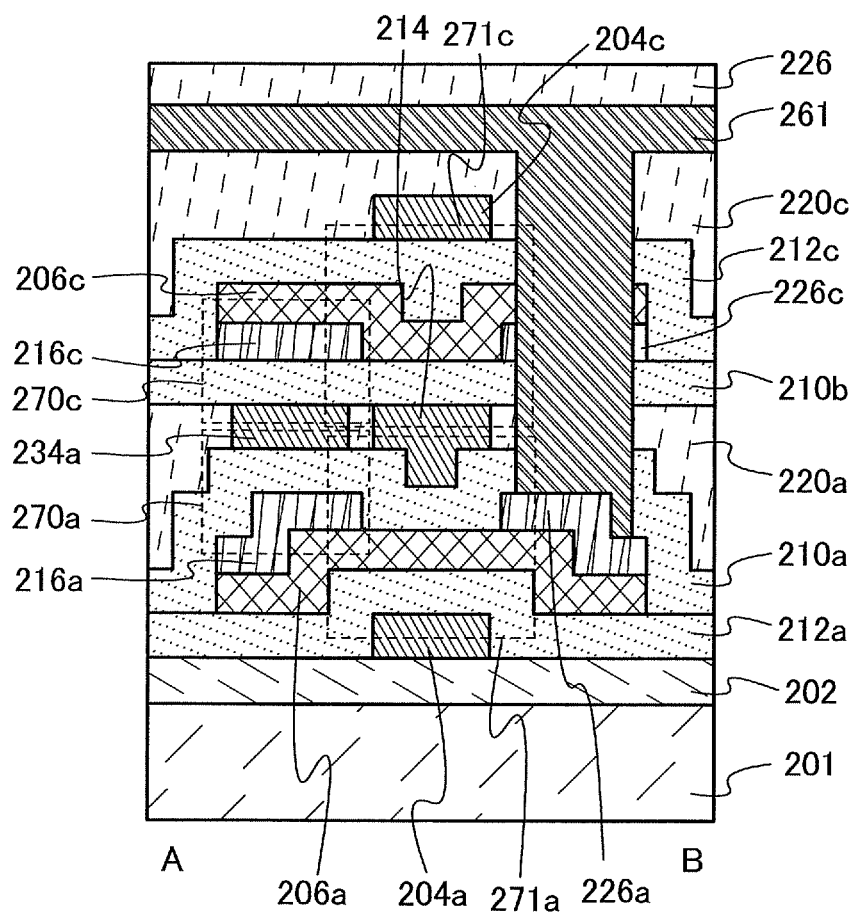

A structure from the substrate 201 to the fifth insulating film 210b in a transistor illustrated in FIG. 16B is the same as that in the transistor illustrated in FIG. 7B. Therefore, Embodiment 2 can be referred to for the description of the components from the substrate 201 to the fifth insulating film 210b.

The semiconductor device illustrated in FIG. 16B includes the first conductive film 204a provided over the first insulating film 202 which is provided over the substrate 201; the second insulating film 212a provided over the first conductive film 204a and the first insulating film 202; the first oxide semiconductor film 206a which is provided over the second insulating film 212a and at least partly overlaps with the first conductive film 204a; the second conductive film 216a and the third conductive film 226a which are provided over the first oxide semiconductor film 206a; the third insulating film 210a provided over the second conductive film 216a, the third conductive film 226a, and the first oxide semiconductor film 206a; the fourth conductive film 234a which is provided over the third insulating film 210a and at least partly overlaps with the second conductive film 216a; the fifth conductive film 214 which is provided over the third insulating film 210a and at least partly overlaps with the first oxide semiconductor film 206a and the first conductive film 204a; the fourth insulating film 220a which is provided over the third insulating film 210a and whose upper surface is level with upper surfaces of the fourth conductive film 234a and the fifth conductive film 214; the fifth insulating film 210b provided over the fourth conductive film 234a, the fifth conductive film 214, and the fourth insulating film 220a; a sixth conductive film 216c which is provided over the fifth insulating film 210b and at least partly overlap with the second conductive film 216a; a seventh conductive film 226c which is provided over the fifth insulating film 210b and at least partly overlap with the third conductive film 226a; a second oxide semiconductor film 206c which is provided over the sixth conductive film 216c, the seventh conductive film 226c, and the fifth insulating film 210b and which at least partly overlaps with the fifth conductive film 214; a sixth insulating film 212c provided over the second oxide semiconductor film 206c; an eighth conductive film 204c which is provided over the sixth insulating film 212c and at least partly overlap with the second oxide semiconductor film 206c and the fifth conductive film 214; a seventh insulating film 220c provided over the eighth conductive film 204c and the sixth insulating film 212c; and a ninth conductive film 261 provided over the seventh insulating film 220c. Note that an opening reaching the third conductive film 226a is formed in the seventh insulating film 220c, the sixth insulating film 212c, the seventh conductive film 226c, the second oxide semiconductor film 206c, the fifth insulating film 210b, the fourth insulating film 220a, and the third insulating film 210a. The ninth conductive film 261 and the third conductive film 226a are in contact with each other through the opening. Note that an eighth insulating film 226 having a planar upper surface is preferably provided over the ninth conductive film 261 and the seventh insulating film 220c.

Here, the description of the sixth conductive film 216b can be referred to for the sixth conductive film 216c. The description of the seventh conductive film 226b can be referred to for the seventh conductive film 226c. The description of the second oxide semiconductor film 206b can be referred to for the second oxide semiconductor film 206c. The description of the sixth insulating film 212b can be referred to for the sixth insulating film 212c. The description of the ninth conductive film 204b can be referred to for the eighth conductive film 204c. The description of the seventh insulating film 220b can be referred to for the seventh insulating film 220c. The description of the tenth conductive film 260 can be referred to for the ninth conductive film 261. The description of the eighth insulating film 225 can be referred to for the eighth insulating film 226.

The capacitor 270a in FIG. 16B corresponds to the capacitor C1 in FIG. 8. The capacitor 270a includes at least part of the second conductive film 216a, at least part of the third insulating film 210a, and at least part of the fourth conductive film 234a. Further, the capacitor C2 in FIG. 8 corresponds to a capacitor 270c in FIG. 16B. The capacitor 270c includes at least part of the sixth conductive film 216c, at least part of the fifth insulating film 210b, and at least part of the fourth conductive film 234a. In other words, the semiconductor device has a structure in which the capacitor line CL2 is not provided and the capacitor C2 is connected to the capacitor line CL1 in FIG. 8.

Further, the transistor Tr1 in FIG. 8 corresponds to the transistor 271a in FIG. 16B. The transistor 271a includes at least part of the first conductive film 204a, at least part of the first oxide semiconductor film 206a, at least part of the second conductive film 216a, at least part of the third conductive film 226a, and at least part of the fifth conductive film 214. The transistor Tr2 in FIG. 8 corresponds to a transistor 271c in FIG. 16B. The transistor 271c includes at least part of the eighth conductive film 204c, at least part of the second oxide semiconductor film 206c, at least part of the sixth conductive film 216c, at least part of the seventh conductive film 226c, and at least part of the fifth conductive film 214.

In other words, the number of the conductive films in the semiconductor device in this embodiment can be reduced by one as compared to that in the semiconductor device in Embodiment 2. Note that the area of a memory cell 281 is the same as that of the memory cell 280.

The description in Embodiment 2 can be referred to for methods for writing and reading data to/from the memory cell.

Since the semiconductor device manufactured as described above has a planar upper surface, the plurality of structures similar to the structure of the semiconductor device can be provided so as to be stacked as exemplified in FIG. 17B. Accordingly, the degree of integration of the semiconductor device can be increased. Further, the number of the layers used for the second gate electrodes of the transistors each including gate electrodes above and below its oxide semiconductor layer can be made small, and thus stress can be prevented from being increased even when the plurality of structures similar to the structure of the semiconductor device are stacked. In other words, the yield of the semiconductor device is not decreased even when the degree of integration of the semiconductor device is increased.

This embodiment can be implemented in appropriate combination with any of the other embodiments.

Embodiment 4

In this embodiment, examples of electronic devices to which any of Embodiments 1 to 3 is applied will be described.

Figure 18A:
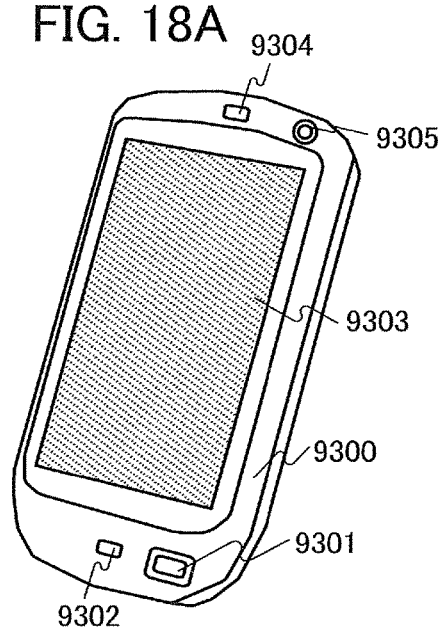
FIGS. 18A to 18C are perspective views each illustrating an electronic device of one embodiment of the present invention.

FIG. 18A illustrates a portable information terminal. The portable information terminal illustrated in FIG. 18A includes a housing 9300, a button 9301, a microphone 9302, a display portion 9303, a speaker 9304, and a camera 9305, and has a function as a mobile phone. One embodiment of the present invention can be applied to the display portion 9303 and the camera 9305. Although not illustrated, an embodiment of the present invention can also be applied to an arithmetic unit, a wireless circuit, or a memory circuit inside the main body.

Figure 18B:
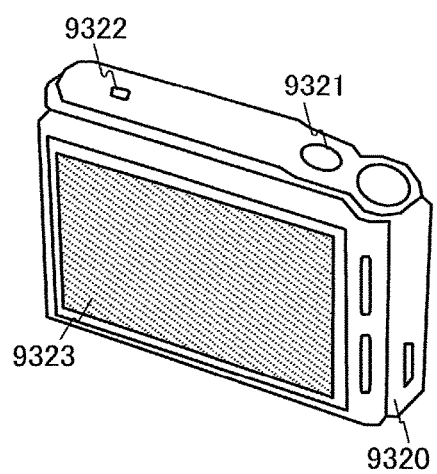

FIG. 18B illustrates a digital still camera. The digital still camera illustrated in FIG. 18B includes a housing 9320, a button 9321, a microphone 9322, and a display portion 9323. One embodiment of the present invention can be applied to a memory circuit inside the digital still camera.

Figure 18C:
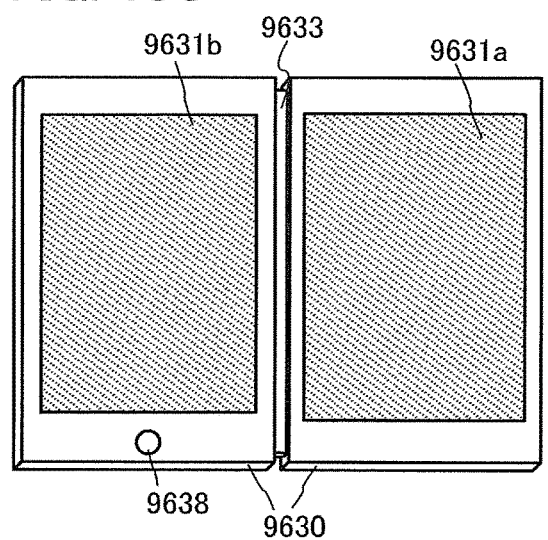

FIG. 18C illustrates a double-foldable portable information terminal. The double-foldable portable information terminal illustrated in FIG. 18C includes a housing 9630, a display portion 9631a, a display portion 9631b, a hinge 9633, and an operation switch 9638.

Part or whole of the display portion 9631a and/or the display portion 9631b can function as a touch panel. By touching an operation key displayed on the touch panel, a user can input data, for example.

By using a semiconductor device of one embodiment of the present invention, the performance of an electronic device can be improved and the reliability of the electronic device can be improved.

This embodiment can be implemented in appropriate combination with any of the other embodiments.

This application is based on Japanese Patent Application serial no. 2011-263867 filed with Japan Patent Office on Dec. 1, 2011, the entire contents of which are hereby incorporated by reference.

What is claimed is:

1. A semiconductor device comprising:
a substrate;
a first transistor over the substrate, the first transistor comprising a first oxide semiconductor film, a first gate insulating film and a first gate electrode; and
a second transistor over the first transistor, the second transistor comprising a second oxide semiconductor film, a second gate insulating film and a second gate electrode,
wherein the first oxide semiconductor film comprises a channel formation region of the first transistor,
wherein the second oxide semiconductor film comprises a channel formation region of the second transistor,
wherein the channel formation region of the first transistor and the channel formation region of the second transistor overlap each other, and
wherein the second oxide semiconductor film is provided over the second gate electrode.

2. The semiconductor device according to claim 1, wherein the first gate electrode and the second gate electrode overlap each other.

3. The semiconductor device according to claim 1, wherein the first oxide semiconductor film is provided over the first gate electrode.

4. The semiconductor device according to claim 1, wherein at least one of the first oxide semiconductor film and the second oxide semiconductor film comprises c-axis aligned crystalline oxide semiconductor.

5. The semiconductor device according to claim 1, wherein a hydrogen concentration in each of the first transistor and the second transistor is $5\times10^{20}$ atoms/cm$^3$ or less.

6. The semiconductor device according to claim 1, wherein the channel formation region of the first transistor is electrically connected to the channel formation region of the second transistor.

7. The semiconductor device according to claim 1, further comprising a capacitor electrically connected to the first transistor,
wherein the capacitor comprises a conductive layer and one of a source electrode and a drain electrode of the first transistor, and
wherein the conductive layer and the second gate electrode are provided in the same layer.

8. The semiconductor device according to claim 1, wherein the first transistor and the second transistor are provided in a memory cell.

9. A semiconductor device comprising:
a substrate;
a wiring;
a first transistor over the substrate, the first transistor comprising a first oxide semiconductor film, a first gate insulating film and a first gate electrode; and
a second transistor over the first transistor, the second transistor comprising a second oxide semiconductor film, a second gate insulating film and a second gate electrode,
wherein the first oxide semiconductor film comprises a channel formation region of the first transistor,
wherein the second oxide semiconductor film comprises a channel formation region of the second transistor,
wherein the channel formation region of the first transistor and the channel formation region of the second transistor overlap each other,
wherein the wiring is electrically connected to the first transistor and the second transistor, and
wherein the wiring is provided over the second gate electrode.

10. The semiconductor device according to claim 9, wherein the first gate electrode and the second gate electrode overlap each other.

11. The semiconductor device according to claim 9, wherein the first oxide semiconductor film is provided over the first gate electrode.

12. The semiconductor device according to claim 9, wherein the second oxide semiconductor film is provided over the second gate electrode.

13. The semiconductor device according to claim 9, wherein at least one of the first oxide semiconductor film and the second oxide semiconductor film comprises c-axis aligned crystalline oxide semiconductor.

14. The semiconductor device according to claim 9, wherein a hydrogen concentration in each of the first transistor and the second transistor is $5 \times 10^{20}$ atoms/cm$^3$ or less.

15. The semiconductor device according to claim 9, wherein the channel formation region of the first transistor is electrically connected to the channel formation region of the second transistor.

16. The semiconductor device according to claim 9, further comprising a capacitor electrically connected to the first transistor,
wherein the capacitor comprises a conductive layer and one of a source electrode and a drain electrode of the first transistor, and
wherein the conductive layer and the second gate electrode are provided in the same layer.

17. The semiconductor device according to claim 9, wherein the first transistor and the second transistor are provided in a memory cell.

18. A semiconductor device comprising:
a substrate;
a first transistor over the substrate, the first transistor comprising a first oxide semiconductor film, a first gate insulating film and a first gate electrode; and
a second transistor over the first transistor, the second transistor comprising a second oxide semiconductor film, a second gate insulating film and a second gate electrode,
wherein the first oxide semiconductor film comprises a channel formation region of the first transistor,
wherein the second oxide semiconductor film comprises a channel formation region of the second transistor,
wherein the channel formation region of the first transistor, and the channel formation region of the second transistor overlap each other, and
wherein at least one of the first oxide semiconductor film and the second oxide semiconductor film comprises c-axis aligned crystalline oxide semiconductor.

19. The semiconductor device according to claim 18, wherein the first gate electrode and the second gate electrode overlap each other.

20. The semiconductor device according to claim 18, wherein the first oxide semiconductor film is provided over the first gate electrode.

21. The semiconductor device according to claim 18, wherein a hydrogen concentration in each of the first transistor and the second transistor is $5 \times 10^{20}$ atoms/cm$^3$ or less.

22. The semiconductor device according to claim 18, wherein the channel formation region of the first transistor is electrically connected to the channel formation region of the second transistor.

23. The semiconductor device according to claim 18, further comprising a capacitor electrically connected to the first transistor,
wherein the capacitor comprises a conductive layer and one of a source electrode and a drain electrode of the first transistor, and
wherein the conductive layer and the second gate electrode are provided in the same layer.

24. The semiconductor device according to claim 18, wherein the first transistor and the second transistor are provided in a memory cell.

* * * * *